(12) United States Patent
Storek et al.

(10) Patent No.: US 12,400,916 B2
(45) Date of Patent: *Aug. 26, 2025

(54) TRANSMISSION-BASED TEMPERATURE MEASUREMENT OF A WORKPIECE IN A THERMAL PROCESSING SYSTEM

(71) Applicants: Beijing E-Town Semiconductor Technology Co., Ltd., Beijing (CN); Mattson Technology, Inc., Fremont, CA (US)

(72) Inventors: Michael Storek, Dornstadt (DE); Rolf Bremensdorfer, Bibertal (DE); Markus Lieberer, Augsburg (DE); Michael Yang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/597,421

(22) Filed: Mar. 6, 2024

(65) Prior Publication Data

US 2024/0290664 A1 Aug. 29, 2024

Related U.S. Application Data

(63) Continuation of application No. 18/185,970, filed on Mar. 17, 2023, now Pat. No. 11,955,388, which is a
(Continued)

(51) Int. Cl.
*H01L 21/66* (2006.01)
*G01J 5/04* (2006.01)
*H01L 21/67* (2006.01)

(52) U.S. Cl.
CPC .............. *H01L 22/12* (2013.01); *G01J 5/042* (2013.01); *H01L 21/67115* (2013.01); *H01L 22/34* (2013.01)

(58) Field of Classification Search
CPC ......... H01L 21/67248; H01L 21/67115; H01L 22/12; H01L 22/34; G01J 5/0007; G01J 5/046; G01J 5/06
See application file for complete search history.

(56) References Cited

U.S. PATENT DOCUMENTS 7,112,763 B2 9/2006 Hunter et al.
7,616,872 B2 11/2009 Camm et al.
(Continued)

FOREIGN PATENT DOCUMENTS

CN 109786279 5/2019
CN 112352142 2/2021
(Continued)

OTHER PUBLICATIONS

Extended European Search Report for GB App. No. 21760554.2, mailed Mar. 18, 2024, 5 pages.
(Continued)

*Primary Examiner* — Alexander G Ghyka
(74) *Attorney, Agent, or Firm* — Dority & Manning, P.A.

(57) ABSTRACT

A thermal processing system for performing thermal processing can include a workpiece support plate configured to support a workpiece and heat source(s) configured to heat the workpiece. The thermal processing system can include window(s) having transparent region(s) that are transparent to electromagnetic radiation within a measurement wavelength range and opaque region(s) that are opaque to electromagnetic radiation within a portion of the measurement wavelength range. A temperature measurement system can include a plurality of infrared emitters configured to emit
(Continued)

infrared radiation and a plurality of infrared sensors configured to measure infrared radiation within the measurement wavelength range where the transparent region(s) are at least partially within a field of view the infrared sensors. A controller can be configured to perform operations including obtaining transmittance and reflectance measurements associated with the workpiece and determining, based on the measurements, a temperature of the workpiece less than about 600° C.

18 Claims, 9 Drawing Sheets

Related U.S. Application Data continuation of application No. 17/183,992, filed on Feb. 24, 2021, now Pat. No. 11,610,824.

(60) Provisional application No. 62/983,064, filed on Feb. 28, 2020.

(56) References Cited

U.S. PATENT DOCUMENTS

| | | | |
|---|---|---|---|
| 7,745,762 B2 | 6/2010 | Timans | |
| 7,976,216 B2 | 7/2011 | Timans | |
| 8,111,978 B2 | 2/2012 | Sorabji et al. | |
| 8,668,383 B2 | 3/2014 | Timans | |
| 8,696,197 B2 | 4/2014 | Timans | |
| 9,482,468 B2 | 11/2016 | Camm et al. | |
| 10,190,915 B2 | 1/2019 | Timans | |
| 10,704,963 B2 | 7/2020 | Jarboe | |
| 11,610,824 B2* | 3/2023 | Storek | H01L 22/34 |
| 11,955,388 B2* | 4/2024 | Storek | G01J 5/06 |
| 2003/0236642 A1* | 12/2003 | Timans | G01J 5/08 |
| | | | 702/99 |
| 2006/0191866 A1* | 8/2006 | Palsulich | B44C 1/22 |
| | | | 216/63 |
| 2009/0323759 A1 | 12/2009 | Govindaraju et al. | |
| 2010/0292951 A1 | 11/2010 | Gaertner et al. | |
| 2011/0295539 A1 | 12/2011 | Tsai et al. | |
| 2012/0201271 A1 | 8/2012 | Timans | |
| 2012/0208377 A1 | 8/2012 | Timans | |
| 2012/0317993 A1* | 12/2012 | Mcray | H01L 21/67201 |
| | | | 62/3.2 |
| 2013/0059403 A1 | 3/2013 | Lee et al. | |
| 2015/0010038 A1 | 1/2015 | Jarboe | |
| 2018/0252587 A1 | 9/2018 | Jarboe et al. | |
| 2019/0025128 A1 | 1/2019 | Clifton et al. | |
| 2019/0391017 A1 | 12/2019 | Ranish | |
| 2020/0064198 A1 | 2/2020 | Bremensdorfer et al. | |
| 2020/0202569 A1 | 6/2020 | Sandsten et al. | |

FOREIGN PATENT DOCUMENTS

| | | |
|---|---|---|
| JP | H10 321539 | 12/1998 |
| JP | 2002299275 | 10/2002 |
| KR | 101078708 B1 | 11/2011 |
| WO | WO 2008102596 | 8/2008 |

OTHER PUBLICATIONS

International Search Report and Written Opinion for Application No. PCT/US2021/019429, mailed Jul. 8, 2021, 10 pages.

* cited by examiner

TRANSMISSION-BASED TEMPERATURE MEASUREMENT OF A WORKPIECE IN A THERMAL PROCESSING SYSTEM

PRIORITY CLAIM

The present application claims the benefit of priority to U.S. patent application Ser. No. 18/185,970, titled "Transmission-Based Temperature Measurement of a Workpiece in a Thermal Processing System" having a filing date of Mar. 17, 2023, which is based on and claims priority to U.S. patent application Ser. No. 17/183,992, titled "Transmission-Based Temperature Measurement of a Workpiece in a Thermal Processing System" having a filing date of Feb. 24, 2021, which is based on and claims priority to U.S. Provisional Application Ser. No. 62/983,064, titled "Transmission-Based Temperature Measurement of a Workpiece in a Thermal Processing System", filed on Feb. 28, 2020, which is incorporated herein by reference.

FIELD

The present disclosure relates generally to thermal processing systems, such as thermal processing systems operable to perform thermal processing of a workpiece.

BACKGROUND

A thermal processing chamber as used herein refers to a device that heats workpieces, such as semiconductor workpieces (e.g., semiconductor workpieces). Such devices can include a support plate for supporting one or more workpieces and an energy source for heating the workpieces, such as heating lamps, lasers, or other heat sources. During heat treatment, the workpiece(s) can be heated under controlled conditions according to a processing regime.

Many thermal treatment processes require a workpiece to be heated over a range of temperatures so that various chemical and physical transformations can take place as the workpiece is fabricated into a device(s). During rapid thermal processing, for instance, workpieces can be heated by an array of lamps through the support plate to temperatures from about 300° C. to about 1,200° C. over time durations that are typically less than a few minutes. During these processes, a primary goal can be to reliably and accurately measure a temperature of the workpiece.

SUMMARY

Aspects and advantages of embodiments of the present disclosure will be set forth in part in the following description, or may be learned from the description, or may be learned through practice of the embodiments.

One example aspect of the present disclosure is directed to a thermal processing system for performing thermal processing of semiconductor workpieces. The thermal processing system can include a workpiece support plate configured to support a workpiece. The thermal processing system can include one or more heat sources configured to heat the workpiece. The thermal processing system can include one or more windows disposed between the workpiece support plate and the one or more heat sources. The one or more windows can include one or more transparent regions that are transparent to at least a portion of electromagnetic radiation within a measurement wavelength range and one or more opaque regions that are opaque to electromagnetic radiation within the portion of the measurement wavelength range.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
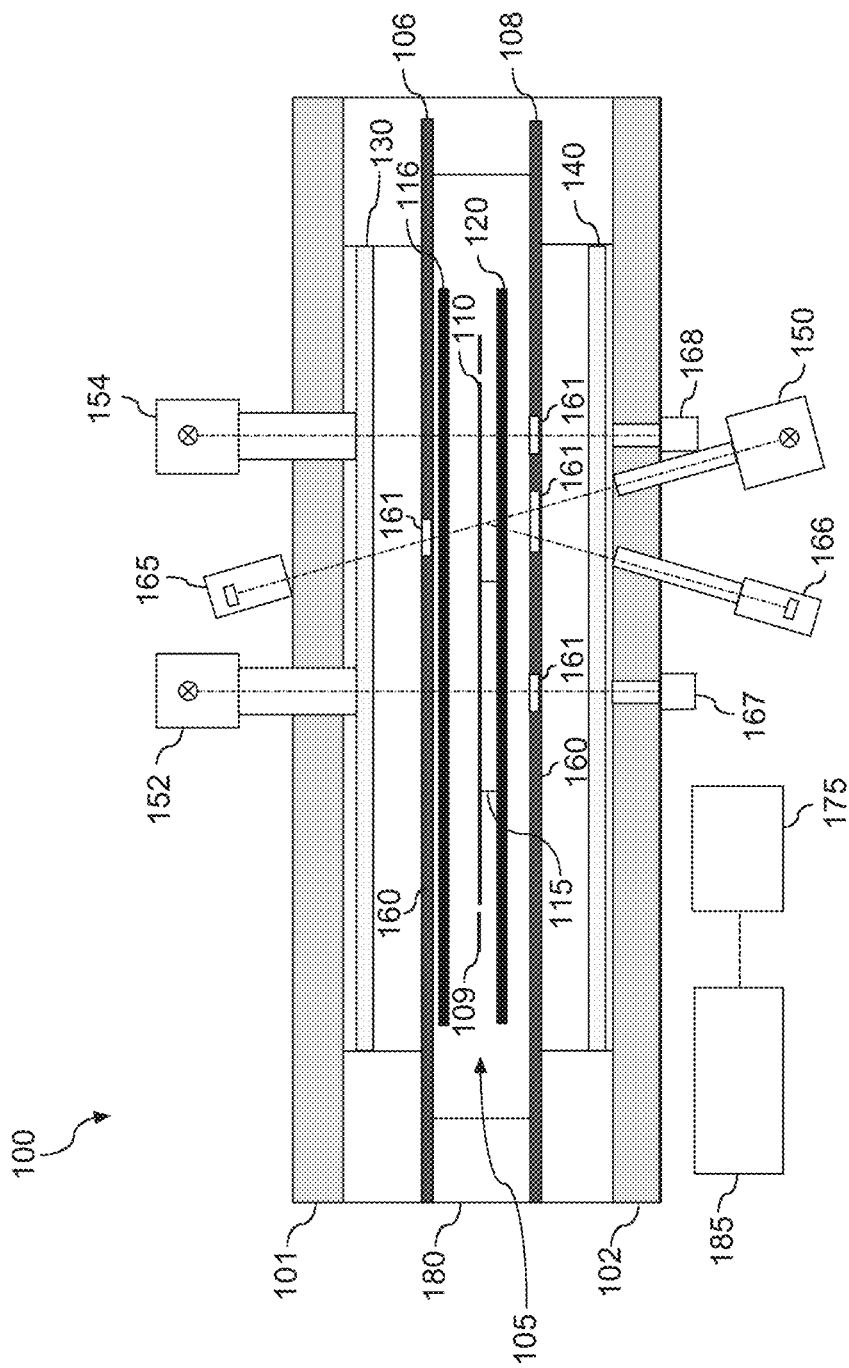
FIG. 1 depicts an example thermal processing system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to thermal processing systems, such as rapid thermal processing (RTP) systems for workpieces, such as semiconductor workpieces (e.g., silicon workpieces). In particular, example aspects of the present disclosure are directed to obtaining a temperature measurement indicative of a temperature of at least a portion of a workpiece within a thermal processing system. For example, a temperature measurement can be useful in monitoring a temperature of a workpiece while thermal processing is being performed on the workpiece.

Example aspects of the present disclosure can be particularly beneficial in obtaining a temperature measurement at workpiece temperatures at which a workpiece is substantially transparent and/or does not emit significant blackbody radiation. In some cases, it can be difficult to measure a workpiece temperature at around these temperatures by conventional methods. In particular, some workpieces, such as non-metallized workpieces (e.g., lightly doped silicon workpieces) can be difficult to measure a temperature of by conventional methods below about 600° C. For instance, the workpieces can be substantially transparent to many wavelengths conventionally used for transmittance measurement at temperatures below about 600° C. Furthermore, the workpieces can be too cold to emit practically measurable blackbody radiation at conventional wavelengths.

Example aspects of the present disclosure can thus allow for accurate transmittance-based and emissivity-compensated temperature measurement of a workpiece at low temperatures, such as below about 600° C., such as from about 400° C. to 600° C. Additionally, sensors used in obtaining the transmittance-based temperature measurement for workpiece temperatures below about 600° C. can be repurposed and/or also used for emission-based temperature measurement of a workpiece for workpiece temperatures at which the workpiece is substantially opaque and/or emits significant blackbody radiation, such as above about 600° C. Additionally, measurement wavelengths and/or other process aspects, including phase-locking of certain measurements, can be selected to minimize interference between various functions of the thermal processing systems. This can allow for systems and methods according to example aspects of the present disclosure to measure temperatures over an increased range, such as an increased range including temperatures below about 600° C., compared to conventional systems and methods. Additionally, this can allow systems and methods to smoothly transition from a transmittance-based temperature measurement for temperatures at which the workpiece does not emit practically measurable blackbody radiation (e.g., below about 600° C.) to an emission-based temperature measurement for temperatures at which the workpiece emits measurable radiation (e.g., above about 600° C.) without requiring additional sensors and/or reconfiguration of the sensors, as the same sensors used for the transmittance-based temperature measurement can be used for the emission-based temperature measurement, such as once the workpiece is no longer at least partially transparent.

According to example aspects of the present disclosure, a thermal processing system, such as a rapid thermal processing system, can include a workpiece support plate configured to support a workpiece. For example, a workpiece can be a workpiece, such as a substrate, to be processed by a thermal processing system. A workpiece can be or include any suitable workpiece, such as a semiconductor workpiece, such as a silicon workpiece. In some embodiments, a workpiece can be or include a lightly doped silicon workpiece. For example, a lightly doped silicon workpiece can be doped such that a resistivity of the silicon workpiece is greater than about 0.1 Ωcm, such as greater than about 1 Ωcm.

A workpiece support plate can be or can include any suitable support structure configured to support a workpiece, such as to support a workpiece in a thermal processing chamber of a thermal processing system. In some embodiments, a workpiece support plate can be configured to support a plurality of workpieces for simultaneous thermal processing by a thermal processing system. In some embodiments, a workpiece support plate can be or include a rotating workpiece support configured to rotate a workpiece while the workpiece is supported by the rotating workpiece support plate. In some embodiments, the workpiece support plate can be transparent to and/or otherwise configured to allow at least some electromagnetic radiation to at least partially pass through the workpiece support plate. For instance, in some embodiments, a material of the workpiece support plate can be selected to allow desired electromagnetic radiation to pass through the workpiece support plate, such as electromagnetic radiation that is emitted by a workpiece and/or emitters and/or measured by sensors in a thermal processing system. In some embodiments, the workpiece support plate can be or include a quartz material.

According to example aspects of the present disclosure, a thermal processing system can include one or more heating sources (e.g., heating lamps) configured to heat a workpiece. For example, one or more heating lamps can emit electromagnetic radiation (e.g., broadband electromagnetic radiation) to heat a workpiece. In some embodiments, one or more heating lamps can be or include, for example, arc lamps, tungsten-halogen lamps, and/or any other suitable heating lamp, and/or combination thereof. In some embodiments, directive elements such as, for example, reflectors (e.g., mirrors) can be configured to direct electromagnetic radiation from one or more heating lamps towards a workpiece and/or workpiece support plate.

According to example aspects of the present disclosure, a thermal processing system can include a temperature measurement system configured to measure a temperature of a workpiece in the thermal processing system. For instance, the temperature measurement system can include a plurality of radiation sensors (e.g., infrared sensors) configured to measure electromagnetic radiation at various points in a thermal processing system (e.g., in a thermal processing chamber). Additionally and/or alternatively, the temperature measurement system can include a plurality of radiation emitters (e.g., infrared emitters) configured to emit electromagnetic radiation into a thermal processing system (e.g., a thermal processing chamber) that passes through various components in the thermal processing system, such as the workpiece, chamber windows, workpiece support plate, and/or other suitable components. Based on the radiation emitted by the emitters and/or measured by the sensors, the temperature measurement system can determine (e.g., estimate) a temperature of the workpiece, as discussed more particularly below. For instance, as one example of a transmittance-based temperature measurement, a transmittance determined for a portion of a workpiece can be compared against a transmittance curve, such as a normalized transmittance curve, to determine a temperature of the portion of the workpiece. As one example of an emission-based temperature measurement, the temperature T of the workpiece can be determined based on radiation emitted by the workpiece, $I_{wafer}$, according to the following equation:

$$T = \frac{hc}{\lambda k} \cdot \frac{1}{\ln\left(\frac{2\pi hc^2 \Delta \lambda}{\lambda^5} \cdot \frac{\varepsilon}{I_{Wafer}} + 1\right)}$$

According to example aspects of the present disclosure, a thermal processing system (e.g., a temperature measurement system) can include a plurality of infrared emitters. Infrared emitters can be configured to emit electromagnetic radiation at one or more infrared wavelengths (e.g., wavelengths from about 700 nanometers to about one millimeter). For instance, infrared emitters can emit infrared radiation directed at least partially at a workpiece. At least a portion of infrared radiation directed at a workpiece can be transmitted through the workpiece. Furthermore, at least a portion of infrared radiation directed at a workpiece can be reflected by the workpiece. In some embodiments, infrared emitters can be positioned outside of a workpiece processing chamber. For example, the infrared emitters positioned outside of a workpiece processing chamber can emit radiation such that the radiation first passes through a chamber sidewall (e.g., a chamber window) prior to passing through a workpiece. In some embodiments, the infrared emitters can be disposed inline with an array of heating elements (e.g., heating lamps). Additionally and/or alternatively, the infrared emitters can be disposed closer to and/or farther from a workpiece than the heating lamps.

According to example aspects of the present disclosure, a thermal processing system can include a plurality of infrared sensors. Infrared sensors can be configured to obtain a measurement of electromagnetic radiation, such as electromagnetic radiation having an infrared wavelength, incident on the infrared sensors. In some embodiments, infrared sensors can be or include a pyrometer. In some embodiments, a pyrometer can be or include a dual-head pyrometer that includes a first head configured to measure a first wavelength of infrared radiation and a second head configured to measure a second wavelength of infrared radiation. In some embodiments, the first wavelength and/or the second wavelength can be within the measurement wavelength range. In some embodiments, the first wavelength can be about 2.3 micrometers and/or the second wavelength can be about 2.7 micrometers.

According to example aspects of the present disclosure, one or more windows (e.g., chamber windows) can be disposed between a workpiece and/or a workpiece support plate and one or more heating lamps. One or more chamber windows can be configured to selectively block at least a portion of electromagnetic radiation (e.g., broadband radiation) emitted by one or more heating lamps from entering a portion of a thermal processing chamber (e.g., being incident on a workpiece and/or a workpiece support plate and/or one or more sensors). For example, one or more chamber windows can include one or more opaque regions and/or one or more transparent regions. As used herein, "opaque" means generally having a transmittance of less than about 0.4 (40%) for a given wavelength, and "transparent" means generally having a transmittance of greater than about 0.4 (40%) for a given wavelength.

The one or more opaque regions and/or one or more transparent regions can be positioned such that the opaque regions block stray radiation at some wavelengths from the heating lamps, and the transparent regions allow, for example, emitters and sensors to freely interact with radiation in the thermal processing chamber at the wavelengths blocked by the opaque regions. In this way, the windows can effectively shield the emitters and sensors from contamination by the heating lamps while still allowing the heating lamps to heat the workpiece. The one or more opaque regions and one or more transparent regions can generally be defined as opaque and transparent, respectively, to a particular wavelength; that is, for at least electromagnetic radiation at the particular wavelength, the opaque regions are opaque and the transparent regions are transparent. For example, in some embodiments, the transparent regions can be transparent to at least a portion of electromagnetic radiation within a measurement wavelength range. In some embodiments, the opaque regions can be opaque to at least a portion of electromagnetic radiation within a measurement range. A measurement range can be or include a wavelength for which an intensity of electromagnetic radiation is measured by at least one sensor in the thermal processing system.

One or more chamber windows, including one or more opaque regions and/or one or more transparent regions, can be formed of any suitable material and/or construction. In some embodiments, one or more chamber windows can be or include a quartz material. Furthermore, in some embodiments, one or more opaque regions can be or include hydroxyl (OH) containing quartz, such as hydroxyl doped quartz (e.g., quartz that is doped with hydroxyl), and/or one or more transparent regions can be or include hydroxyl free quartz (e.g., quartz that is not doped with hydroxyl). Advantages of hydroxyl doped quartz and hydroxyl free quartz can include an case of manufacturing. For instance, the hydroxyl free quartz regions can be shielded during hydroxyl doping of a monolithic quartz window to produce both hydroxyl doped regions (e.g., opaque regions) and hydroxyl free regions (e.g., transparent regions) in the monolithic window. Additionally, hydroxyl doped quartz can exhibit desirable wavelength blocking properties in accordance with the present disclosure. For instance, hydroxyl doped quartz can block radiation having a wavelength of about 2.7 micrometers, which can correspond to a measurement wavelength at which some sensors in the thermal processing system operate, while hydroxyl free quartz can be transparent to radiation having a wavelength of about 2.7 micrometers. Thus, the hydroxyl doped quartz regions can shield the sensors from stray radiation in the thermal processing system (e.g., from the heating lamps), and the hydroxyl free quartz regions can be disposed at least partially within a field of view (e.g., a region for which the sensors are configured to measure infrared radiation) of the sensors to allow the sensors to obtain measurements within the thermal processing system. Additionally, hydroxyl doped quartz can be partially opaque (e.g., have a transmittance around 0.6, or 60%) to radiation having a wavelength of about 2.3 micrometers, which can at least partially reduce contamination from stray radiation in the thermal processing system (e.g., from the heating lamps).

Infrared radiation emitted by an infrared emitter and/or measured by an infrared sensor can have one or more associated wavelengths. For instance, in some embodiments, an infrared emitter can be or include a narrow-band infrared emitter that emits radiation such that a wavelength range of the emitted radiation is within a tolerance of a numerical value, such as within 10% of the numerical value, in which case the emitter is referred to by the numerical value. In some embodiments, this can be accomplished by a combination of a wideband emitter that emits a wideband spectrum (e.g., a Planck spectrum) and an optical filter, such as an optical notch filter, configured to pass only a narrow band within the wideband spectrum. Similarly, an infrared sensor can be configured to measure an intensity of infrared narrow-band infrared radiation at (e.g., within a tolerance of) a numerical value. For example, in some embodiments, an infrared sensor, such as a pyrometer, can include one or more heads configured to measure (e.g., select for measurement) a particular narrow-band wavelength.

In some embodiments, infrared radiation emitted by an infrared emitter and/or measured by an infrared sensor can be within a measurement wavelength range, which may be or include a continuous range and/or a noncontinuous range. The measurement wavelength range can be selected based on characteristics of a workpiece and/or a workpiece processing system. For example, the measurement wavelength range can include wavelengths that a workpiece and/or transparent regions in one or more chamber windows are transparent to for at least temperatures less than about 600° C. Additionally and/or alternatively, the measurement wavelength range can include wavelengths that opaque regions in one or more chamber windows are opaque to for at least temperatures less than about 600° C. In this manner, the emitters can emit radiation that is substantially transmitted through the transparent regions and at least partially protected, by the opaque regions, from contamination by heating lamps before being incident on the sensors. Although it can be desirable, in some embodiments, to eliminate contamination by heating lamps in the measurement wavelength range, the measurement wavelength range can nonetheless include wavelengths having contamination from heating lamps (e.g., wavelengths that can at least partially pass through the opaque regions). Additionally and/or alternatively, the measurement wavelength range can include wavelengths at which a workpiece emits significant (e.g., measurable) blackbody radiation for at least temperatures greater than about 600° C. In some embodiments, the measurement wavelength range can include about 2.3 micrometers and/or about 2.7 micrometers. For instance, in some embodiments, one or more infrared sensors can be configured to measure an intensity of infrared radiation in a field of view of the sensor at about 2.3 micrometers. Similarly, one or more infrared sensors can be configured to measure an intensity of infrared radiation in a field of view of the sensor at about 2.7 micrometers.

In some embodiments, a temperature measurement system can include an emissivity measurement system configured to measure (e.g., estimate) emissivity of a workpiece. As one example of measuring emissivity of a workpiece, an emissivity measurement system can include an infrared emitter configured to emit infrared radiation directed toward a workpiece. In some embodiments, the infrared emitter can emit infrared radiation directed at an oblique angle towards a surface of a workpiece (e.g., at an angle less than 90 degrees from the surface of the workpiece). In this manner, a transmitted portion of the emitted radiation can be transmitted through the workpiece and a reflected portion of the emitted radiation can be reflected by the surface of the workpiece. An angle of reflection for the reflected portion can be predicted and/or known based on characteristics of the workpiece. Infrared sensors can be positioned to measure the transmitted portion and/or the reflected portion. Based at least in part on the first portion and/or the second portion, the emissivity measurement system can determine emissivity of a workpiece. In some embodiments, the emissivity measurement system, such as the emitter and/or the sensors, can operate at a first wavelength of a measurement wavelength range. For instance, the first wavelength can be a wavelength at which the transparent regions of the chamber windows are transparent and/or the opaque regions are opaque. In some embodiments, the first wavelength can be or include about 2.7 micrometers.

Additionally and/or alternatively, a thermal processing system (e.g., a temperature measurement system) can include a transmittance measurement system. The transmittance measurement system can be configured to obtain one or more transmittance measurements of a workpiece. For example, in some embodiments, the transmittance measurement system can obtain a center transmittance measurement of a center portion of a workpiece (e.g., by a center sensor, such as a center pyrometer) and an edge transmittance measurement of an edge portion of the workpiece (e.g., by an edge sensor, such as an edge pyrometer). In some embodiments, the transmittance measurement system can include one or more infrared emitters configured to emit infrared radiation directed orthogonally to a surface of a workpiece. Additionally, the transmittance measurement system can include one or more infrared sensors disposed opposite the one or more infrared emitters and configured to measure a portion of the infrared radiation emitted by the one or more infrared emitters and passing through the workpiece.

It can be possible to determine a temperature of a workpiece based on transmittance of the workpiece. However, transmittance of a workpiece is not correlated with only temperature. For instance, workpiece characteristics such as, for example, bulk doping levels, reflective properties of the workpiece surface, and workpiece thickness can all affect transmittance. As such, a temperature measurement system can, in some embodiments, determine a normalized transmittance measurement correlated with workpiece temperature. For example, the normalized transmittance measurement can range from 0 to 1, regardless of workpiece characteristics.

Additionally and/or alternatively, sensor measurements used to determine transmittance of a workpiece can be impacted by other components in the chamber, such as, for example, a workpiece support plate, chamber windows, and/or any other components, and especially components that must pass infrared radiation emitted by an emitter and measured by a sensor. According to example aspects of the present disclosure, a thermal processing system (e.g., a temperature measurement system), can determine a reference intensity, denoted herein as $I_0$, for each of one or more sensors in the thermal processing system. A reference intensity can correspond to radiation emitted by an emitter and/or incident on a sensor when a workpiece is not present in the processing chamber. In other words, the reference intensity can be diminished from the intensity of radiation emitted by an emitter only by contributions from components other than the workpiece in the thermal processing system. This can additionally correspond to a case of 100% transmittance by a workpiece. In some embodiments, the reference intensity can be measured prior to insertion of a workpiece in the processing chamber, such as between thermal processing of two workpieces.

In some embodiments, the transmittance measurement system can operate at a same wavelength as an emissivity measurement system (e.g., the first wavelength). Additionally and/or alternatively, the transmittance measurement system can operate at a second wavelength distinct from the first wavelength. For example, in some embodiments, the second wavelength can be a wavelength at which the one or more opaque regions of the chamber windows, although opaque for the first wavelength, are not opaque for the second wavelength, such that radiation at the first wavelength is blocked by the opaque regions and radiation at the second wavelength is at least partially allowed through the opaque regions. For example, transmittance of the opaque regions at the second wavelength can be greater than transmittance at the first wavelength. In some embodiments, the second wavelength can be 2.3 micrometers.

In some cases, it can be desirable and/or necessary to use a second wavelength for the transmittance measurement system that is not entirely shielded by the chamber windows.

For example, spatial considerations, interference considerations, and/or other factors can cause a thermal processing system at the first wavelength to be undesirable. As one example, although the emissivity measurement system can include a transmittance measurement used to determine the emissivity, which could be correlated to temperature of the workpiece, it can sometimes be desirable to obtain temperature measurements at multiple regions of the workpiece. For instance, obtaining temperature measurements at multiple regions, such as a center portion and/or an edge portion, can allow for improved monitoring of process uniformity. However, additional sensors can be required to obtain the temperature measurements over multiple regions. Furthermore, the transmittance measurement can require emitters to be placed opposite the additional sensors, which can, in some cases, also require transparent regions to be disposed within a field of view of the emitters for the transmittance measurements to function at the first wavelength. In some embodiments, however, these additional sensors can, in addition to being used for a transmittance measurement, be used for an emission measurement in accordance with example aspects of the present disclosure. These transparent regions can, in some cases, contribute to contamination from the heating lamps in the measurements from the additional sensors, especially in cases where the sensors are used for emission measurements. Thus, although one method to solve this problem is to configure the chamber with additional transparent regions, other solutions can be employed, including phase-locking of the emissions and/or sensor measurements, as discussed in more detail below.

In some embodiments, the plurality of infrared emitters and/or the plurality of infrared sensors can be phase-locked. For instance, in some embodiments, radiation emitted by one or more emitters can be pulsed at a pulsing frequency. The pulsing frequency can be selected to be or include a frequency having little to no radiation components in the thermal processing system. For example, in some embodiments, the pulsing frequency can be about 130 Hz. In some embodiments, a pulsing frequency of 130 Hz can be particularly advantageous as the heating lamps can emit substantially no radiation having a frequency of 130 Hz. As one example of pulsing one or more emitters, a chopper wheel having one or more slits can be revolved in a field of view of the one or more emitters, such that a constant stream of radiation from the one or more emitters is intermittently allowed, at the pulsing frequency, past the chopper wheel. Thus, the constant stream of radiation can be converted by the revolution of the chopper wheel into a pulsed radiation stream at the pulsing frequency.

Additionally and/or alternatively, one or more sensors can be phase-locked based on the pulsing frequency. For example, the transmittance measurement system can be configured to isolate a measurement from a sensor based on the pulsing frequency. As one example, the transmittance measurement system can compare measurements at the pulsing frequency to measurements not at the pulsing frequency, such as by subtracting a measurement immediately prior to the measurement made at the pulsing frequency to isolate signal contributions from components at the pulsing frequency from interfering components. In other words, sensor measurements that are not phase-locked to the pulsing frequency (e.g., obtained with the same or greater frequency than the pulsing frequency and/or out of phase with the phase-locked measurements) can be indicative of only stray radiation in the chamber and/or sensor measurements that are phase-locked to the pulsing frequency can be indicative of a sum of stray radiation and emitted radiation from an emitter. Thus, the emitted radiation can be isolated by subtracting out the known amount of stray radiation from a measurement that is not phase-locked. As one example, if the pulsing frequency is 130 Hz, the sensor can obtain measurements at 260 Hz or greater, such that one or more stray intensity measurements are associated with each phase-locked measurement. In this way, the transmittance measurement system can reduce interference from stray radiation (e.g., stray light) in measurements from a sensor.

Systems and methods according to example aspects of the present disclosure can provide a number of technical effects and benefits related to thermal processing of a workpiece. As one example, systems and methods according to example aspects of the present disclosure can provide accurate temperature measurements at workpiece temperatures at which a workpiece is substantially transparent and/or does not emit significant blackbody radiation. For instance, systems and methods according to example aspects of the present disclosure can allow for accurate temperature measurement below about 600° C. regardless of workpiece composition.

Another technical effect of the present disclosure can be an improved range of temperature measurement. For instance, systems according to example aspects of the present disclosure can allow for accurate transmittance-based and emissivity-compensated temperature measurement of a workpiece at low temperatures, such as below about 600° C., such as from about 400° C. to 600° C. Additionally, sensors used in obtaining the transmittance-based temperature measurement for workpiece temperatures below about 600° C. can be repurposed and/or also used for emission-based temperature measurement of a workpiece for workpiece temperatures at which the workpiece is substantially opaque and/or emits significant blackbody radiation, such as above about 600° C. Additionally, measurement wavelengths and/or other process aspects, including phase-locking of certain measurements, can be selected to minimize interference between various functions of the thermal processing systems. This can allow for systems and methods according to example aspects of the present disclosure to measure temperatures over an increased range, such as an increased range including temperatures below about 600° C., compared to conventional systems and methods. Additionally, this can allow systems and methods to smoothly transition from a transmittance-based temperature measurement for temperatures at which the workpiece does not emit practically measurable blackbody radiation (e.g., below about 600° C.) to an emission-based temperature measurement for temperatures at which the workpiece emits measurable radiation (e.g., above about 600° C.) without requiring additional sensors and/or reconfiguration of the sensors, as the same sensors used for the transmittance-based temperature measurement can be used for the emission-based temperature measurement, such as once the workpiece is no longer at least partially transparent.

Variations and modifications can be made to these example embodiments of the present disclosure. As used in the specification, the singular forms "a," "and," and "the" include plural referents unless the context clearly dictates otherwise. The use of "first," "second," "third," etc., are used as identifiers and are not necessarily indicative of any ordering, implied or otherwise. Example aspects may be discussed with reference to a "substrate," "workpiece," or "workpiece" for purposes of illustration and discussion. Those of ordinary skill in the art, using the disclosures provided herein, will understand that example aspects of the present disclosure can be used with any suitable workpiece.

The use of the term "about" in conjunction with a numerical value refers to within 20% of the stated numerical value.

With reference now to the FIGS., example embodiments of the present disclosure will now be discussed in detail. FIG. 1 depicts an example rapid thermal processing (RTP) system 100 according to example embodiments of the present disclosure. As illustrated, the RTP system 100 includes an RTP chamber 105 including a top 101 and bottom 102, windows 106, 108, workpiece 110, workpiece support plate 120, heat sources 130, 140 (e.g., heating lamps), infrared emitters 150, 152, 154, sensors 165, 166, 167, 168 (e.g., pyrometers, such as dual-head pyrometers), controller 175, sidewall/door 180, and gas flow controller 185.

The workpiece 110 to be processed is supported in the RTP chamber 105 (e.g., a quartz RTP chamber) by the workpiece support plate 120. The workpiece support plate 120 can be a workpiece support operable to support a workpiece 110 during thermal processing. Workpiece 110 can be or include any suitable workpiece, such as a semiconductor workpiece, such as a silicon workpiece. In some embodiments, workpiece 110 can be or include a lightly doped silicon workpiece. For example, a lightly doped silicon workpiece can be doped such that a resistivity of the silicon workpiece is greater than about 0.1 Ωcm, such as greater than about 1 Ωcm.

Workpiece support plate 120 can be or include any suitable support structure configured to support workpiece 110, such as to support workpiece 110 in RTP chamber 105. In some embodiments, workpiece support plate 120 can be configured to support a plurality of workpieces 110 for simultaneous thermal processing by a thermal processing system. In some embodiments, workpiece support plate 120 can rotate workpiece 110 before, during, and/or after thermal processing. In some embodiments, workpiece support plate 120 can be transparent to and/or otherwise configured to allow at least some electromagnetic radiation to at least partially pass through workpiece support plate 120. For instance, in some embodiments, a material of workpiece support plate 120 can be selected to allow desired electromagnetic radiation to pass through workpiece support plate 120, such as electromagnetic radiation that is emitted by workpiece 110 and/or emitters 150, 152, 154. In some embodiments, workpiece support plate 120 can be or include a quartz material, such as a hydroxyl free quartz material.

Workpiece support plate 120 can include at least one support pin 115 extending from workpiece support plate 120. In some embodiments, workpiece support plate 120 can be spaced from top plate 116. In some embodiments, the support pins 115 and/or the workpiece support plate 120 can transmit heat from heat sources 140 and/or absorb heat from workpiece 110. In some embodiments, the support pins 115, guard ring 109, and top plate 116 can be made of quartz.

A guard ring 109 can be used to lessen edge effects of radiation from one or more edges of the workpiece 110. Sidewall/door 180 allows entry of the workpiece 110 and, when closed, allows the chamber 105 to be sealed, such that thermal processing can be performed on workpiece 110. For example, a process gas can be introduced into the RTP chamber 105. Two banks of heat sources 130, 140 operable to heat the workpiece 110 in the RTP chamber 105 (e.g., lamps, or other suitable heat sources) are shown on either side of the workpiece 110. Windows 106, 108 can be configured to block at least a portion of radiation emitted by the heat sources 130, 140, as described more particularly below.

RTP system 100 can include heat sources 130, 140. In some embodiments, heat sources 130, 140 can include one or more heating lamps. For example, heat sources 130, 140 including one or more heating lamps can emit electromagnetic radiation (e.g., broadband electromagnetic radiation) to heat workpiece 110. In some embodiments, for example, heat sources 130, 140 can be or include arc lamps, tungsten-halogen lamps, and/or any other suitable heating lamp, and/or combination thereof. In some embodiments, directive elements (not depicted) such as, for example, reflectors (e.g., mirrors) can be configured to direct electromagnetic radiation from heat sources 130, 140 into RTP chamber 105.

According to example aspects of the present disclosure, windows 106, 108 can be disposed between workpiece 110 and heat sources 130, 140. Windows 106, 108 can be configured to selectively block at least a portion of electromagnetic radiation (e.g., broadband radiation) emitted by heat sources 130, 140 from entering a portion of rapid thermal processing chamber 105. For example, windows 106, 108 can include opaque regions 160 and/or transparent regions 161. As used herein, "opaque" means generally having a transmittance of less than about 0.4 (40%) for a given wavelength, and "transparent" means generally having a transmittance of greater than about 0.4 (40%) for a given wavelength.

Opaque regions 160 and/or transparent regions 161 can be positioned such that the opaque regions 160 block stray radiation at some wavelengths from the heat sources 130, 140, and the transparent regions 161 allow, for example, emitters 150, 152, 154 and/or sensors 165, 166, 167, 168 to freely interact with radiation in RTP chamber 105 at the wavelengths blocked by opaque regions 160. In this way, the windows 106, 108 can effectively shield the RTP chamber 105 from contamination by heat sources 130, 140 at given wavelengths while still allowing the heat sources 130, 140 to heat workpiece 110. Opaque regions 160 and transparent regions 161 can generally be defined as opaque and transparent, respectively, to a particular wavelength; that is, for at least electromagnetic radiation at the particular wavelength, the opaque regions 160 are opaque and the transparent regions 161 are transparent.

Chamber windows 106, 108, including opaque regions 160 and/or transparent regions 161, can be formed of any suitable material and/or construction. In some embodiments, chamber windows 106, 108 can be or include a quartz material. Furthermore, in some embodiments, opaque regions 160 can be or include hydroxyl (OH) containing quartz, such as hydroxyl doped quartz (e.g., quartz that is doped with hydroxyl), and/or transparent regions 161 can be or include hydroxyl free quartz (e.g., quartz that is not doped with hydroxyl). Advantages of hydroxyl doped quartz and hydroxyl free quartz can include an case of manufacturing. For instance, the hydroxyl free quartz regions can be shielded during hydroxyl doping of a monolithic quartz window to produce both hydroxyl doped regions (e.g., opaque regions) and hydroxyl free regions (e.g., transparent regions) in the monolithic window. Additionally, hydroxyl doped quartz can exhibit desirable wavelength blocking properties in accordance with the present disclosure. For instance, hydroxyl doped quartz can block radiation having a wavelength of about 2.7 micrometers, which can correspond to a measurement wavelength at which some sensors (e.g., sensors 165, 166, 167, 168) in the thermal processing system 100 operate, while hydroxyl free quartz can be transparent to radiation having a wavelength of about 2.7 micrometers. Thus, the hydroxyl doped quartz regions can shield the sensors (e.g., sensors 165, 166, 167, 168) from stray radiation in the rapid thermal processing chamber 105 (e.g., from heat sources 130, 140), and the hydroxyl free quartz regions can be disposed at least partially within a field of view of the sensors to allow the sensors to obtain measurements within the thermal processing system. Additionally, hydroxyl doped quartz can be partially opaque (e.g., have a transmittance around 0.6, or 60%) to radiation having a wavelength of about 2.3 micrometers, which can at least partially reduce contamination from stray radiation in rapid thermal processing system 100 (e.g., from heat sources 130, 140).

Gas controller 185 can control a gas flow through RTP system 100, which can include an inert gas that does not react with the workpiece 110 and/or a reactive gas such as oxygen or nitrogen that reacts with the material of the workpiece 110 (e.g. a semiconductor workpiece, etc.) to form a layer of on the workpiece 110. In some embodiments, an electrical current can be run through the atmosphere in RTP system 100 to produce ions that are reactive with or at a surface of workpiece 110, and to impart extra energy to the surface by bombarding the surface with energetic ions.

Figure 2:
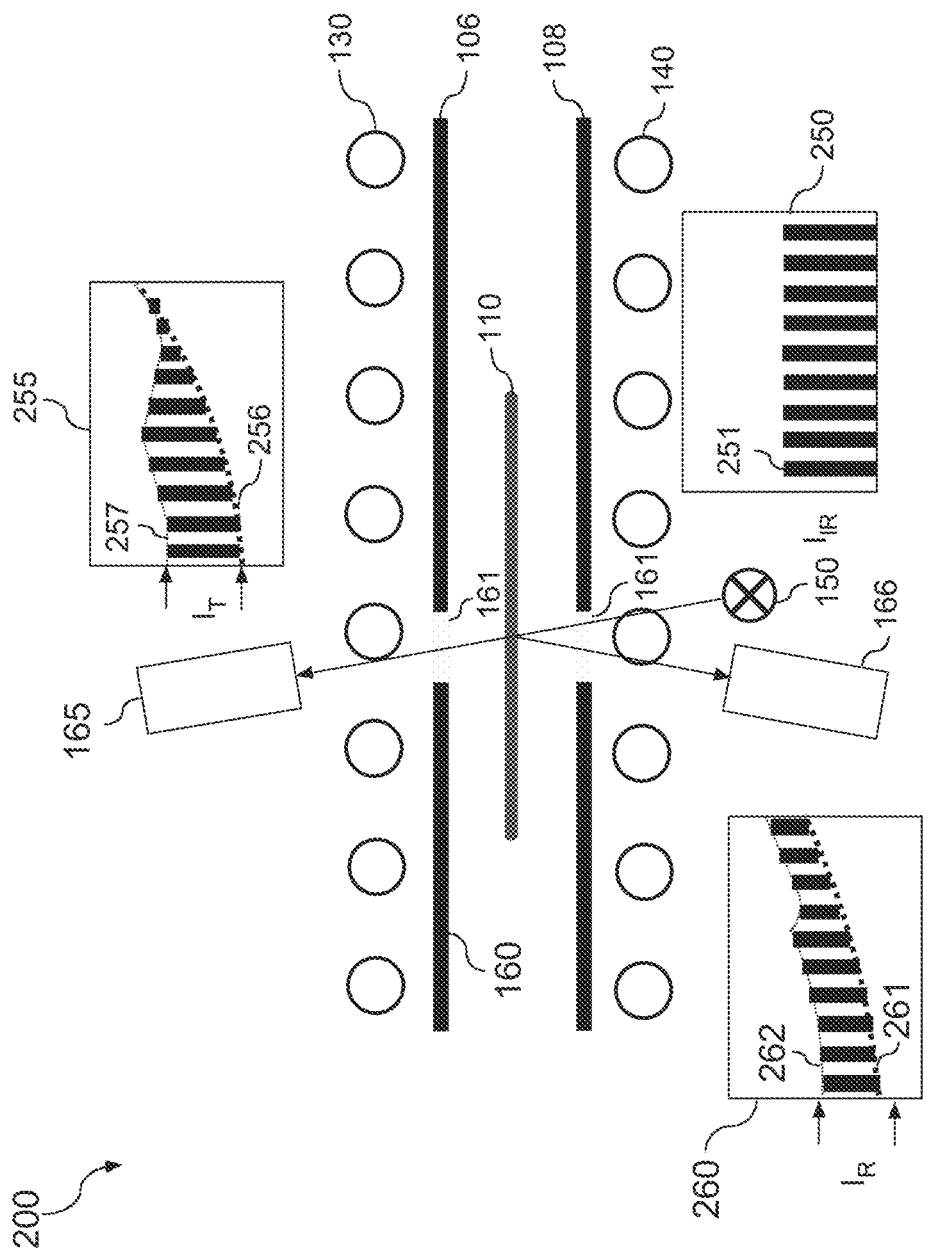
FIG. 2 depicts an example thermal processing system configured to measure an emissivity of a workpiece according to example aspects of the present disclosure.
Figure 3:
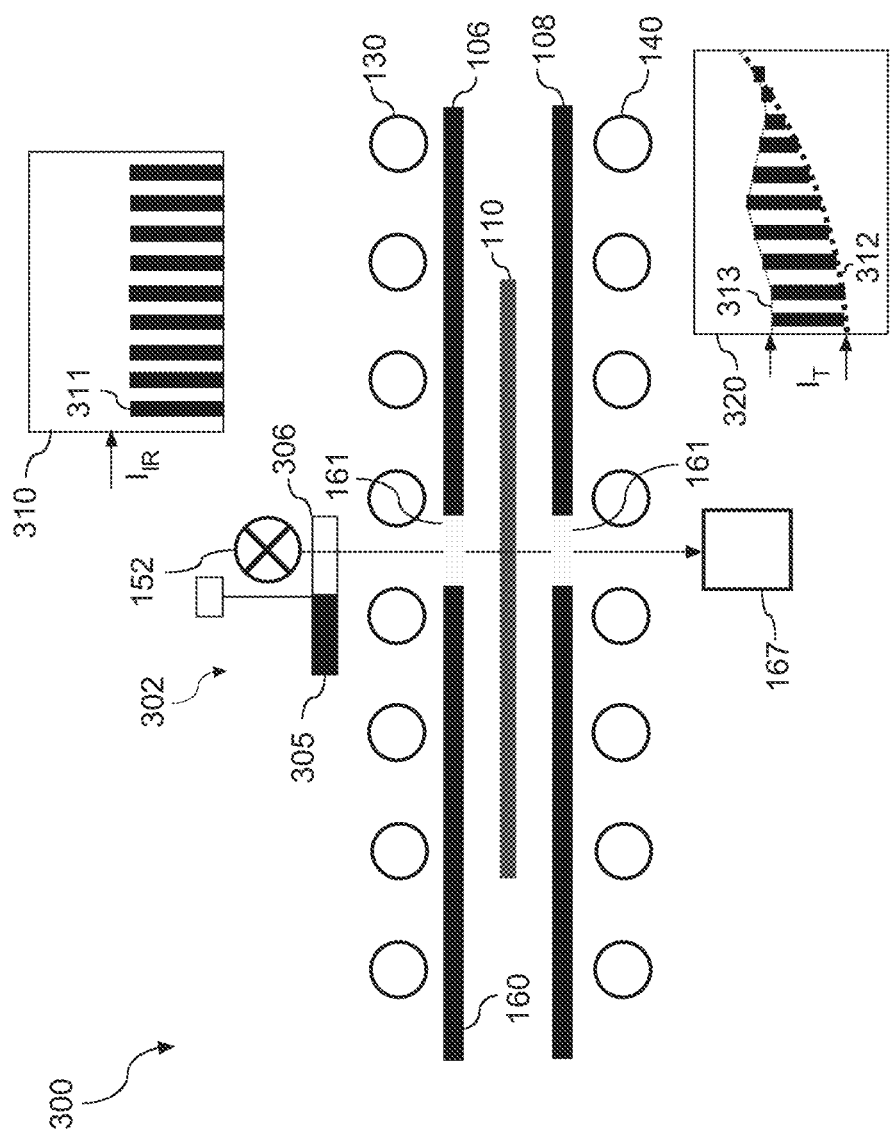
FIG. 3 depicts an example thermal processing system configured to measure a temperature of a workpiece according to example aspects of the present disclosure.
Figure 4:
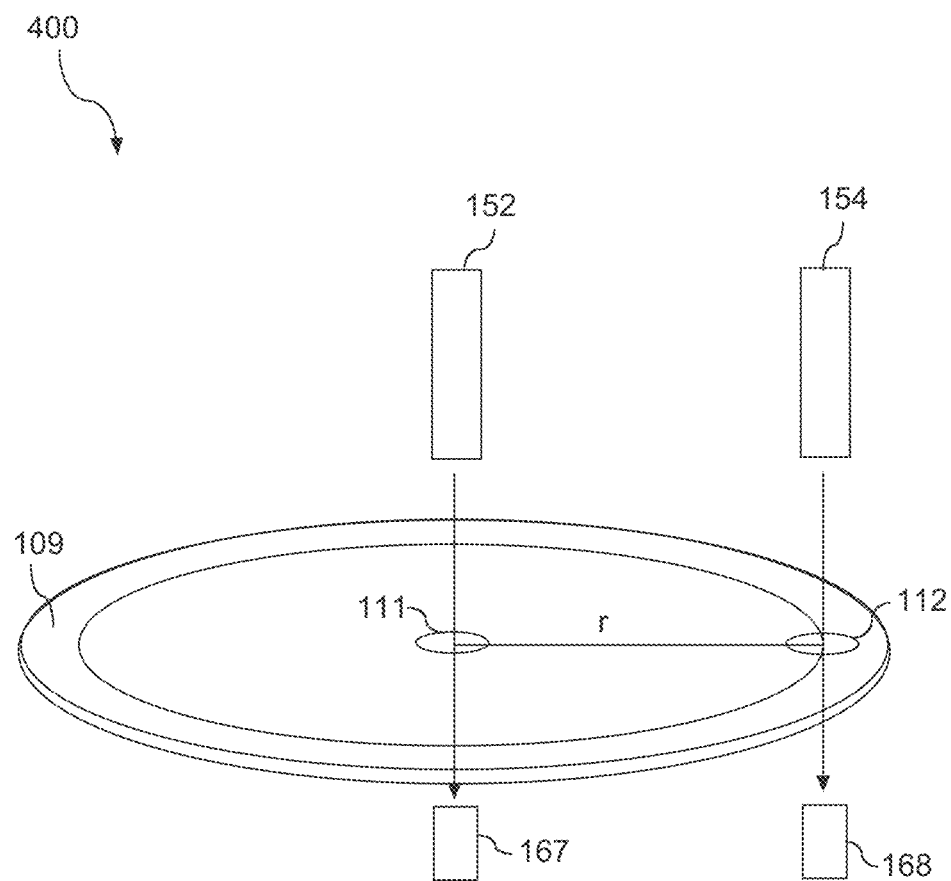
FIG. 4 depicts an example temperature measurement system according to example aspects of the present disclosure.

The controller 175 controls various components in RTP chamber to direct thermal processing of workpiece 110. For example, controller 175 can be used to control heat sources 130 and 140. Additionally and/or alternatively, controller 175 can be used to control the gas flow controller 185, the door 180, and/or a temperature measurement system, including, for instance, emitters 150, 152, 154 and/or sensors 165, 166, 167, 168. The controller 175 can be configured to measure a temperature of the workpiece, which will be discussed more particularly with respect to the following figures. For instance, FIG. 2 depicts a thermal processing system 200 including one or more components of thermal processing system 100 configured to perform in-situ emissivity determination of a workpiece. FIG. 3 depicts at least a thermal processing system 300 including one or more components of thermal processing system 100 configured to perform transmittance-based and/or emission-based temperature measurement of a workpiece. Similarly, FIG. 4 depicts a temperature measurement system 400 including one or more components of thermal processing system 100 configured to perform transmittance-based and/or emission-based temperature measurement of a workpiece.

As used herein, a controller, control system, or similar can include one or more processors and one or more memory devices. The one or more processors can be configured to execute computer-readable instructions stored in the one or more memory devices to perform operations, such as any of the operations for controlling a thermal processing system described herein.

FIG. 1 depicts an example thermal processing system 100 for purposes of illustration and discussion. Those of ordinary skill in the art, using the disclosures provided herein, will understand that aspects of the present disclosure can be used with other thermal processing systems for workpieces without deviating from the scope of the present disclosure.

FIG. 2 depicts an example thermal processing system 200 for purposes of illustration and discussion. In particular, thermal processing system includes one or more components as discussed with respect to thermal processing system 100 of FIG. 1 FIG. 1. In particular, FIG. 2 depicts at least components useful in determining an in-situ emissivity measurement of workpiece 110, including at least emitter 150 and sensors 165 and 166. As depicted in FIG. 2, emitter 150 can be configured to emit infrared radiation directed at an oblique angle to workpiece 110. A transmitted portion of the emitted radiation emitted by emitter 150 is transmitted through workpiece 110 and incident on transmittance sensor 165. A reflected portion of the emitted radiation emitted by emitter 150 is reflected by workpiece 110 and incident on reflectance sensor 166. An emissivity of the workpiece can be determined by the transmitted portion and the emitted portion. For example, the transmittance of workpiece 110 can be represented by the intensity of radiation incident on transmittance sensor 165. Additionally, the reflectance of workpiece 110 can be represented by the intensity of radiation incident on reflectance sensor 166. From transmittance and reflectance, transmissivity $\tau$ and reflectivity $\rho$ can be determined as a ratio of transmittance and reflectance, respectively, to a reference intensity $I_0$ which can represent intensities at the sensors 165, 166 when no workpiece is present in the thermal processing system 200. From that, emissivity $\varepsilon$ can be calculated as:

$$\varepsilon = 1 - (\rho + \tau)$$

According to example aspects of the present disclosure, one or more transparent regions 161 can be disposed at least partially in a field of view of emitter 150 and/or sensors 165, 166. For instance, emitter 150 and/or sensors 165, 166 can operate at a measurement wavelength range that the transparent regions 161 are transparent to. For example, in some embodiments, emitter 150 and/or sensors 165, 166 can operate at 2.7 micrometers. As illustrated in FIG. 2, the transparent regions 161 can be positioned such that a radiation flow (indicated generally by arrows) is able to flow from emitter 150 through the transparent regions 161 and to sensors 165, 166, without obstruction by windows 106, 108 (e.g., opaque regions 160). Similarly, opaque regions 160 can be disposed in regions on windows 106, 108 that are outside of the radiation flow to shield workpiece 110 and especially sensors 165, 166 from radiation in the measurement wavelength range from heat sources 130, 140. For example, in some embodiments, transparent regions 161 can be included for sensors and/or emitters operating at 2.7 micrometer wavelengths.

In some embodiments, emitter 150 and/or sensors 165, 166 can be phase-locked. For instance, in some embodiments, emitter 150 and/or sensors 165, 166 can be operated according to a phase-locked regime. For instance, although opaque regions 160 can be configured to block most stray radiation from heat sources 130, 140 at a first wavelength, in some cases stray radiation can nonetheless be perceived by the sensors 165, 166, as discussed above. Operating the emitter 150 and/or sensors 165, 166 according to a phase-locked regime can contribute to improved accuracy in intensity measurements despite the presence of stray radiation.

For instance, in some embodiments, radiation emitted by emitter 150 can be pulsed at a pulsing frequency. The pulsing frequency can be selected to be or include a frequency having little to no radiation components in the thermal processing system 200. For example, in some embodiments, the pulsing frequency can be about 130 Hz. In some embodiments, a pulsing frequency of 130 Hz can be particularly advantageous as the heat sources 130, 140 can emit substantially no radiation having a frequency of 130 Hz. Additionally and/or alternatively, sensors 165, 166 can be phase-locked based on the pulsing frequency. For instance, the thermal processing system 200 (e.g., a controller, such as controller 175 of FIG. 1), can isolate a measurement (e.g., an intensity measurement) from the sensors 165, 166 based on the pulsing frequency. In this way, thermal processing system 200 can reduce interference from stray radiation in measurements from sensors 165, 166.

An example phase locking regime is discussed with respect to plots 250, 255, 260. Plot 250 depicts radiation intensity for radiation $I_{IR}$ emitted within the measurement wavelength range by emitter 150 over time (e.g., over a duration of a thermal process performed on workpiece 110). As illustrated in plot 250, radiation intensity emitted by emitter 150 can be emitted as pulses 251. For instance, emitter 150 can be pulsed by a chopper wheel (not illustrated). A chopper wheel can include one or more blocking portions and/or one or more passing portions. A chopper wheel can be revolved in a field of view of emitter 150 such that a constant stream of radiation from emitter 150 is intermittently interrupted by blocking portions and passed by passing portions at the pulsing frequency. Thus, a constant stream of radiation emitted by emitter 150 can be converted by the revolution of a chopper wheel into a pulsed radiation stream at the pulsing frequency.

Plot 255 depicts transmitted radiation intensity $I_T$ measured by transmittance sensor 165 over time. Similarly, plot 260 depicts reflected radiation intensity $I_R$ measured by reflectance sensor 166 over time. Plots 255 and 260 illustrate that, over time (e.g., as workpiece 110 increases in temperature), stray radiation in the chamber (illustrated by stray radiation curves 256 and 261, respectively) can increase. This can be attributable to, for example, decreasing transparency of workpiece 110 and/or increasing emissions of workpiece 110 with respect to an increased temperature of the workpiece 110, increased intensity of the heat sources 130, 140, and/or various other factors related to thermal processing of workpiece 110.

During a point in time at which the emitter 150 is not emitting radiation, the sensors 165, 166 can obtain measurements corresponding to the stray radiation curves 256, 261, respectively (e.g., stray radiation measurements). Similarly, during a point in time at which the emitter 150 is emitting radiation (e.g., pulse 251), the sensors 165, 166 can obtain measurements corresponding to total radiation curves 257, 262, respectively (e.g., total radiation measurements). Thus, transmitted radiation intensity $I_T$ (e.g., attributable to transmittance τ) can be determined based at least in part the difference between time-coordinated (e.g., subsequent) total radiation measurements (e.g., representing curve 256) and stray radiation measurements (e.g., representing curve 256). Furthermore, transmittance τ can be determined by a ratio of the transmitted radiation intensity $I_T$ to a reference intensity $I_0$. Similarly, reflected radiation intensity $I_R$ (e.g., attributable to reflectance ρ) can be determined based at least in part the difference between time-coordinated (e.g., subsequent) total radiation measurements (e.g., representing curve 262) and stray radiation measurements (e.g., representing curve 261). Furthermore, reflectance ρ can be determined by a ratio of the reflected radiation intensity $I_R$ to reference intensity $I_0$. In some embodiments, reference intensity $I_0$ can be measured by sensors 165, 166 as a result of a pulse and/or constant radiation from emitter 150 when no workpiece 110 is present in thermal processing system 200. From the transmittance τ and reflectance ρ, the emissivity ε can be calculated by:

$$\varepsilon = 1 - (\rho + \tau)$$

FIG. 3 depicts an example thermal processing system 300 according to example aspects of the present disclosure. Thermal processing system 300 can be configured to perform thermal processing on and/or to measure a temperature of workpiece 110. In particular, thermal processing system can include one or more components as discussed with respect to thermal processing system 100 of FIG. 1 FIG. 1. In particular, FIG. 3 depicts at least components useful in determining a transmittance-based and/or emission-based temperature measurement of workpiece 110, including at least center emitter 152 and center sensor 167. In some embodiments, edge emitter 154 and/or edge sensor 168 can operate similarly to center emitter 152 and/or center sensor 154 on an edge portion of workpiece 110, as discussed with respect to FIG. 3, but are omitted from being depicted in FIG. 3 for the purposes of illustration. This is discussed further below with respect to FIG. 4.

As depicted in FIG. 3, center emitter 152 can be configured to emit infrared radiation directed at an orthogonal angle to a surface of workpiece 110, as illustrated by the arrow in FIG. 3. A transmitted portion of radiation emitted by center emitter 152 is transmitted through workpiece 110 and incident on center sensor 167. In some embodiments, transparent regions 161 of windows 106, 108 can be disposed within a field of view of center emitter 152 and/or sensor 167. For instance, center emitter 152 and/or center sensor 167 can operate at a measurement wavelength range that the transparent regions 161 are transparent to. For example, in some embodiments, center emitter 152 and/or center sensor 167 can operate at 2.7 micrometers. As illustrated in FIG. 3, the transparent regions 161 can be positioned such that a radiation flow (indicated generally by arrows) is able to flow from center emitter 152 through the transparent regions 161 and to center sensor 167, without obstruction by windows 106, 108 (e.g., opaque regions 160). Similarly, opaque regions 160 can be disposed in regions on windows 106, 108 that are outside of the radiation flow to shield workpiece 110 and especially center sensor 167 from radiation in the measurement wavelength range from heat sources 130, 140. For example, in some embodiments, transparent regions 161 can be included for sensors and/or emitters operating at 2.7 micrometer wavelengths.

In some embodiments, however, including transparent regions 161 in windows 106 disposed within a field of view of center emitter 152 can undesirably allow radiation emitted by heat sources 130 to contaminate measurements by center sensor 167 and/or other sensors (not illustrated) in thermal processing system 300. For example, in some embodiments, center sensor 167 can additionally be configured to measure thermal radiation emitted by workpiece 110 at a measurement wavelength range for which the transparent regions 161 are transparent. Radiation emitted by heat sources 130 can have an increased risk of contaminating this workpiece emission measurement if transparent regions 161 are disposed in a field of view of center emitter 152.

One solution to this problem is to omit transparent region 161 in a field of view of center emitter 152 and instead include an opaque region 160. Additionally, center emitter 152 and/or center sensor 167 can be operated at a second wavelength in a measurement wavelength range for which opaque region 160 is at least partially transparent. For example, in some embodiments, the second wavelength can be 2.3 micrometers. In this way, despite the presence of opaque region 160, radiation emitted by center emitter 152 can pass through the windows 106 and 108 and be measured by center sensor 167 without requiring the inclusion of potentially contaminating transparent regions. Furthermore, because of the inclusion of opaque region 160, measurements from center sensor 167 indicative of an intensity of emitted radiation (e.g., emitted radiation measurements) emitted by workpiece 110 (e.g., at temperatures at which workpiece 110 emits radiation, such as above about 600° C.) are not contaminated by the stray radiation. The above discussed solution can introduce an additional problem, however. Because the radiation at the second wavelength from center emitter 152 is able to pass through opaque regions 160, so too can stray radiation at the second wavelength from, for example, heat sources 130, 140.

Thus, in some embodiments, center emitter 152 and/or center sensor 167 can be phase-locked. In some embodiments, center emitter 152 and/or center sensor 167 can be operated according to a phase-locked regime. For instance, although opaque regions 160 can be configured to block most stray radiation from heat sources 130, 140 at a first wavelength, in some cases stray radiation, especially stray radiation at a second wavelength, can nonetheless be perceived by the center sensor 167, as discussed above. Operating the center emitter 152 and/or center sensor 167 according to a phase-locked regime can contribute to improved accuracy in intensity measurements despite the presence of stray radiation.

For instance, in some embodiments, radiation emitted by center emitter 152 can be pulsed at a pulsing frequency. The pulsing frequency can be selected to be or include a frequency having little to no radiation components in the thermal processing system 300. For example, in some embodiments, the pulsing frequency can be about 130 Hz. In some embodiments, a pulsing frequency of 130 Hz can be particularly advantageous as the heat sources 130, 140 can emit substantially no radiation having a frequency of 130 Hz.

Additionally and/or alternatively, center sensor 167 can be phase-locked based on the pulsing frequency. For instance, the thermal processing system 300 (e.g., a controller, such as controller 175 of FIG. 1), can isolate a measurement (e.g., an intensity measurement) from the center sensor 167 based on the pulsing frequency. In this way, thermal processing system 300 can reduce interference from stray radiation in measurements from center sensor 167.

An example phase locking regime is discussed with respect to plots 310 and 320. Plot 310 depicts radiation intensity for radiation $I_{IR}$ emitted within the measurement wavelength range by center emitter 152 over time (e.g., over a duration of a thermal process performed on workpiece 110). Plot 320 depicts transmitted radiation intensity $I_T$ measured by center sensor 167 over time. As illustrated in plot 310, radiation intensity emitted by center emitter 152 can be emitted as pulses 311. For instance, center emitter 152 can be pulsed by chopper wheel 302. Chopper wheel 302 can include one or more blocking portions 305 and/or one or more passing portions 306. Chopper wheel 302 can be revolved in a field of view of center emitter 152 such that a constant stream of radiation from center emitter 152 is intermittently interrupted by blocking portions 305 and passed by passing portions 306 at the pulsing frequency. Thus, a constant stream of radiation emitted by center emitter 152 can be converted by the revolution of chopper wheel 302 into a pulsed radiation stream at the pulsing frequency.

During a point in time at which the center emitter 152 is not emitting radiation, the center sensor 167 can obtain measurements corresponding to the stray radiation curve 312 (e.g., stray radiation measurements). Similarly, during a point in time at which the center emitter 152 is emitting radiation (e.g., pulse 311), the center sensor 167 can obtain measurements corresponding to a total radiation curve 313 (e.g., total radiation measurements). Thus, transmitted radiation intensity $I_T$ (e.g., attributable to transmittance τ) can be determined based at least in part the difference between time-coordinated (e.g., subsequent) total radiation measurements (e.g., representing curve 313) and stray radiation measurements (e.g., representing curve 312). Furthermore, transmittance τ can be determined by a ratio of the transmitted radiation intensity $I_T$ to a reference intensity $I_0$. For example, reference intensity $I_0$ can be measured by center sensor 167 as a result of a pulse and/or constant radiation from center emitter 152 when no workpiece 110 is present in thermal processing system 300. The transmittance τ can be compared to a transmittance curve (e.g., workpiece transmittance curves 602, 604, 606 of FIG. 6A that are respective to a particular workpiece composition, and/or normalized workpiece transmittance curve 652 of FIG. 6B) to determine a temperature of the workpiece.

Plot 320 illustrates that, over time (e.g., as workpiece 110 increases in temperature), stray radiation in the chamber (illustrated by stray radiation curve 312) can increase. This can be attributable to, for example, decreasing transparency of workpiece 110 and/or increasing emissions of workpiece 110 with respect to an increased temperature of the workpiece 110, increased intensity of the heat sources 130, 140, and/or various other factors related to thermal processing of workpiece 110. For instance, as can be seen in plot 320, stray radiation curve 312 and total radiation curve 313 tend to converge as time progresses (e.g., as temperature increases). This can be a result of, for example, decreasing transparency of workpiece 110 with respect to increasing temperature. Thus, in some cases (e.g., for silicon workpieces), the transmittance-based temperature measurement as described above can exhibit decreased reliability above a certain temperature (e.g., about 600° C.). Thus, according to example aspects of the present disclosure, a thermal processing system (e.g., any of thermal processing systems 100, 200, 300) can transition from a first temperature measurement process (e.g., a transmittance-based temperature measurement process) to a second temperature measurement process (e.g., an emission-based temperature measurement process) at a temperature threshold. For example, the temperature threshold can be about 600° C. The temperature threshold can correspond to a workpiece temperature at which the workpiece 110 exhibits substantial blackbody radiation at a wavelength that can be detected by center sensor 167. Additionally and/or alternatively, the temperature threshold can correspond to a workpiece temperature at which the workpiece 110 is opaque to radiation emitted by center emitter 152. For instance, in some embodiments, the temperature threshold can correspond to a point at which stray radiation curve 312 and total radiation curve 313 have converged, or, in other words, the magnitude of transmitted radiation intensity $I_T$ is below a magnitude threshold.

For instance, in some embodiments, center sensor 167 can be configured to measure radiation emitted by workpiece 110 at the measurement wavelength range. For example, in some embodiments, center sensor 167 can be a dual head pyrometer having a first head configured to measure a first wavelength of a measurement wavelength range. The first wavelength can be or include a wavelength that transparent regions 161 are transparent to and/or opaque regions 160 are opaque to, such as, for example, 2.7 micrometers, in embodiments where the opaque regions 160 include hydroxyl doped quartz. The first wavelength can additionally correspond to a wavelength of blackbody radiation emitted by workpiece 110. Additionally, center sensor 167 can have a second head configured to measure a second wavelength of the measurement wavelength range. The second wavelength can be or include a wavelength that opaque regions 160 are not opaque to, such as, for example, 2.3 micrometers, in embodiments where the opaque regions 160 include hydroxyl doped quartz. The second wavelength can additionally correspond to a wavelength emitted by center emitter 152.

Thus, according to example aspects of the present disclosure, center sensor 167 can obtain transmittance measurements associated with transmittance of workpiece 110 for temperatures of workpiece 110 below a temperature threshold, and can additionally obtain emission measurements associated with an intensity of blackbody radiation emitted by workpiece 110 for temperatures above the temperature threshold. Thus, temperature of workpiece 110 can be determined by transmittance measurements at temperatures below a temperature threshold, as described above. Additionally and/or alternatively, temperature of workpiece 110 can be determined by emission measurements at temperatures above a temperature threshold. For instance, temperature of a workpiece can be determined by emission measurements based on the following equation:

$$T = \frac{hc}{\lambda k} \cdot \frac{1}{\ln\left(\frac{2\pi hc^2 \Delta \lambda}{\lambda^5} \cdot \frac{\varepsilon}{I_{Wafer}} + 1\right)}$$

FIG. 4 depicts an example temperature measurement system 400 according to example aspects of the present disclosure. Temperature measurement system 400 can be configured to measure a temperature of workpiece 110, which can be supported at least in part by support ring 109. Temperature measurement system 400 can include center emitter 152 and edge emitter 154. Additionally, temperature measurement system 400 can include center sensor 167 and edge sensor 168. Emitters 152, 154 and/or sensors 167, 168 can operate as discussed with regard to center emitter 152 and/or center sensor 168 of FIG. 3. For instance, center emitter 152 and center sensor 167 can be disposed such that radiation emitted by center emitter 152 passes through center portion 111 of workpiece 110 and is then incident on center sensor 167. Similarly, edge emitter 154 and edge sensor 168 can be disposed such that radiation emitted by edge emitter 154 passes through edge portion 112 of workpiece 110 and is incident on edge sensor 168. In this way, center sensor 167 can be configured to obtain a temperature measurement of center portion 111 and/or edge sensor 168 can be configured to obtain a temperature measurement of edge portion 112. In some embodiments, center portion 111 can include a portion of the workpiece defined by less than about 50% of a radius r of the workpiece, such as about 10% of the radius r. In some embodiments, edge portion can include a portion of the workpiece defined by greater than about 50% of a radius r of the workpiece, such as about 90% of the radius r.

Figure 5A:
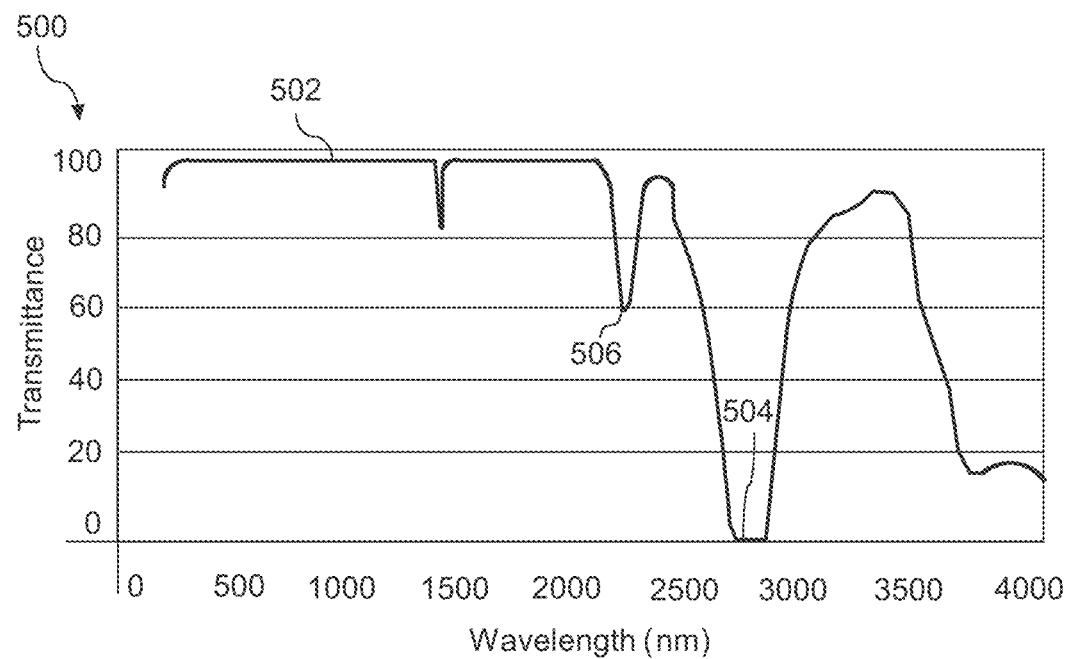
FIG. 5A depicts a transmittance plot for an example opaque region material according to example aspects of the present disclosure.

FIG. 5A depicts a plot 500 of an example transmittance curve 502 for an example material composing an example opaque region. For example, transmittance curve 502 is illustrated for an example material such as hydroxyl doped quartz. As illustrated in FIG. 5A, the example opaque region can be substantially opaque to some wavelengths and substantially transparent to others. In particular, the example transmittance curve 502 includes an opaque range 504 and a partially opaque range 506. As discussed herein, a measurement wavelength range can advantageously include wavelengths in the opaque range 504 and/or partially opaque range 506. For instance, radiation in the opaque range 504 and/or partially opaque range 506 can be at least partially blocked by the example opaque region, which can prevent radiation emitted by heating lamps from entering a thermal processing chamber and contaminating measurements from sensors configured to measure the opaque range 504 and/or partially opaque range 506.

Figure 5B:
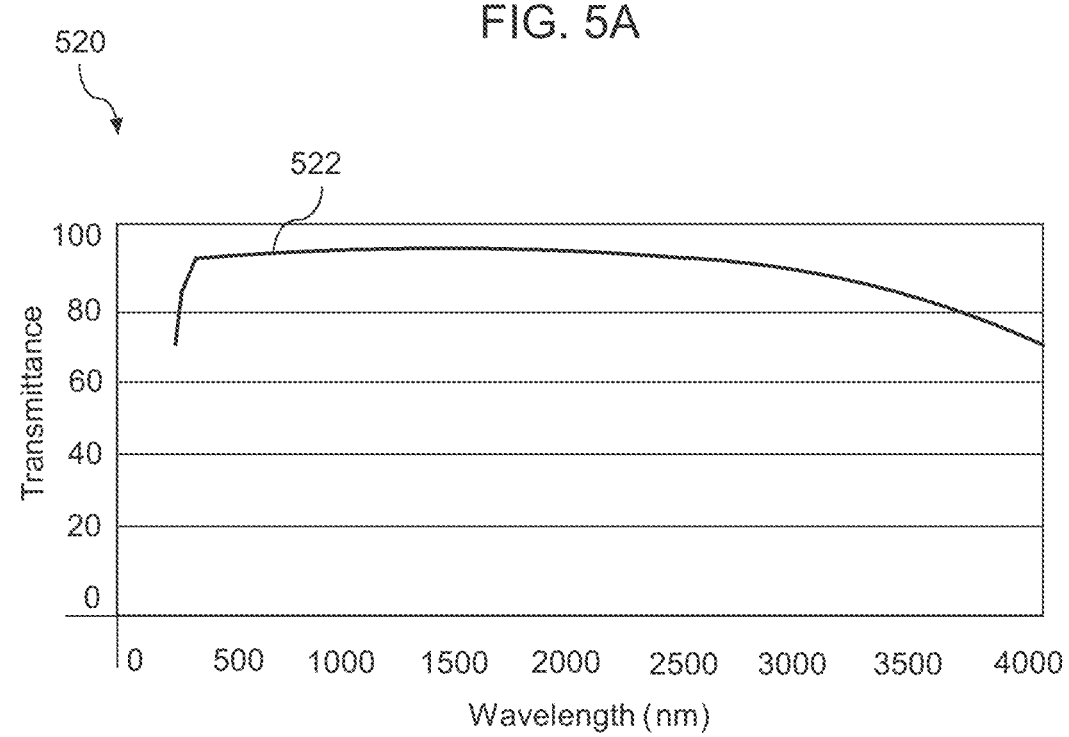
FIG. 5B depicts a transmittance plot for an example transparent region material according to example aspects of the present disclosure.

FIG. 5B depicts a plot 520 of an example transmittance curve 522 for an example material composing an example transparent region. For example, transmittance curve 522 is illustrated for an example material such as hydroxyl free quartz. As illustrated in FIG. 5B, the example transparent region can be substantially transparent over some wavelengths. Although the example transmittance curve 522 is depicted as substantially transparent over most wavelengths, the example transparent region can additionally include opaque ranges. Generally, it is desirable that the example transparent region is transparent at measurement ranges (e.g., at wavelengths corresponding to opaque range 504 and/or partially opaque range 506 of FIG. 5A).

Figure 6A:
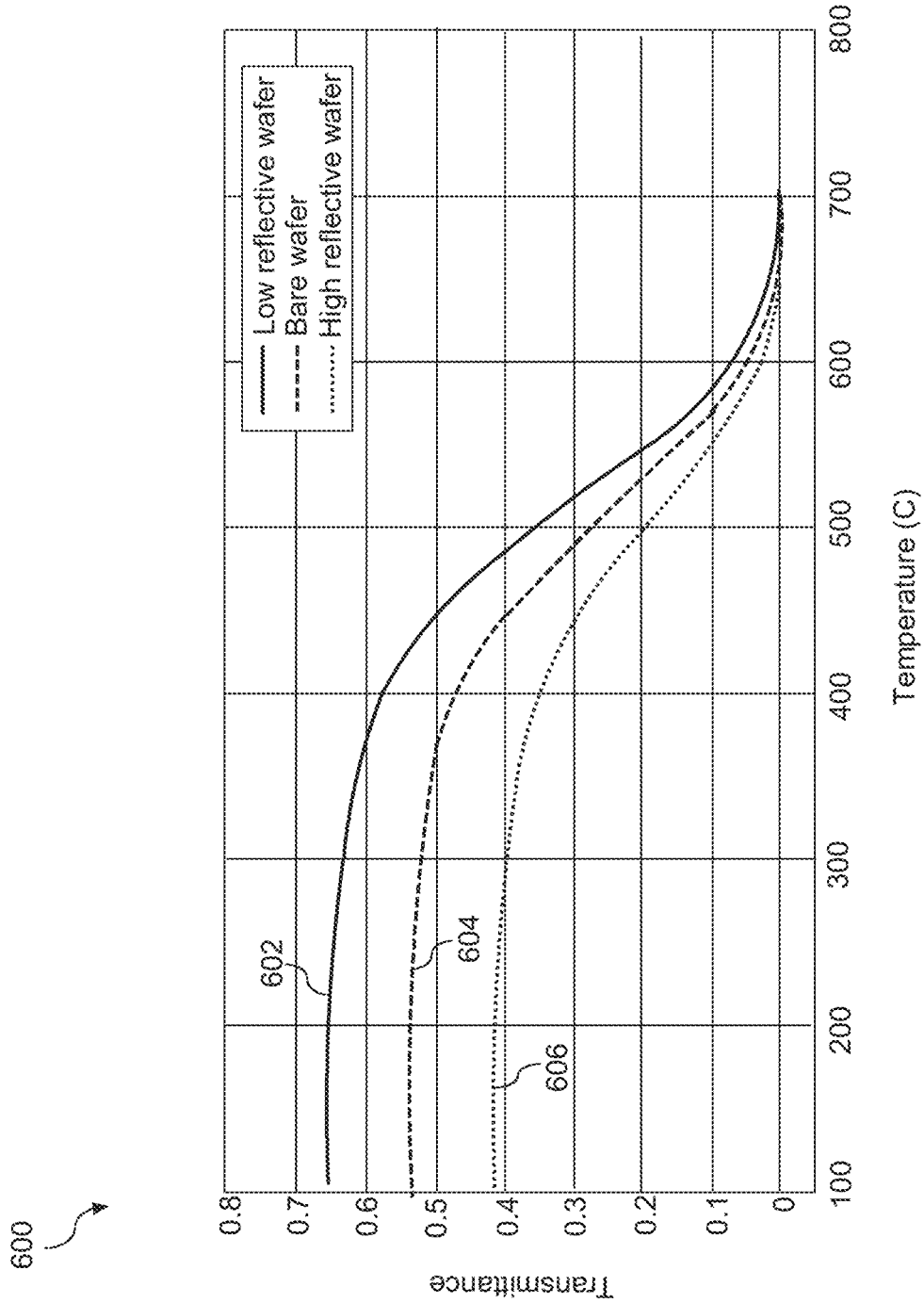
FIG. 6A depicts a transmittance plot for example workpiece types according to example aspects of the present disclosure.
Figure 6B:
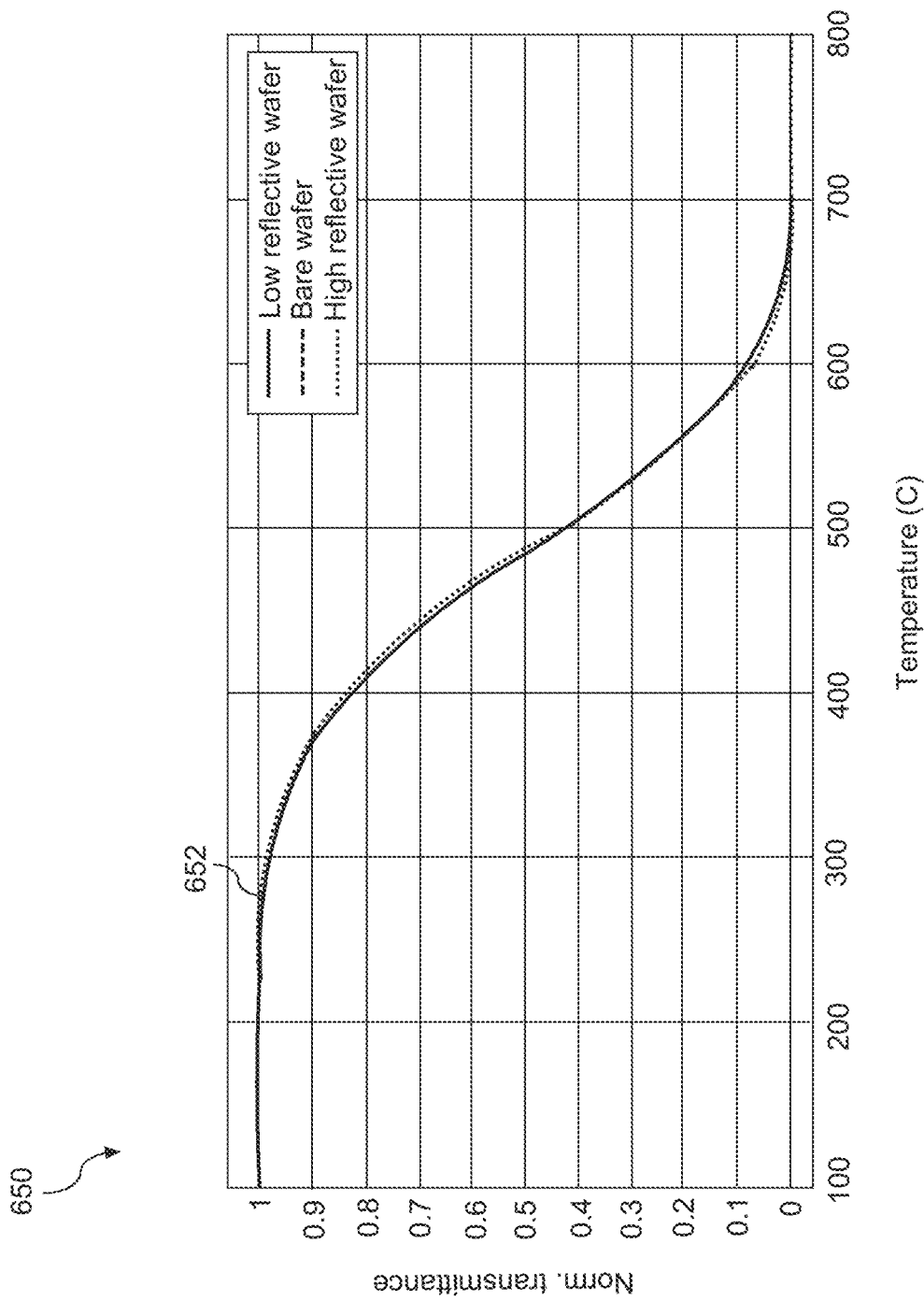
FIG. 6B depicts a transmittance plot of example normalized workpiece transmittance according to example aspects of the present disclosure.

FIG. 6A depicts a plot 600 of example transmittance curves 602, 604, 606 for three example workpiece types. For instance, curve 602 is associated with a workpiece having a lower reflectivity, curve 604 is associated with a workpiece having a moderate reflectivity (e.g., a bare workpiece), and curve 606 is associated with a workpiece having a higher reflectivity. As illustrated in FIG. 6A, although each of curves 602, 604, 606 follows a general trend, the values of the transmittance for each workpiece can vary based on surface characteristics (e.g., reflectivity) of the workpiece. Thus, FIG. 6B depicts a plot 650 of an example normalized or nominal workpiece transmittance curve 652. As illustrated in FIG. 6B, the normalized workpiece transmittance curve 652 represents transmittance from a maximum of 1 to a minimum of 0 for a particular workpiece, but is irrespective of a particular transmittance value of the workpiece. In other words, the normalized workpiece transmittance curve 652 can be similar and/or identical for each of a low reflective workpiece, a bare workpiece, and/or a high reflective workpiece. Thus, a normalized transmittance measurement obtained for a workpiece can be compared to normalized workpiece transmittance curve 652 such that transmittance can be directly correlated to temperature, irrespective of surface characteristics of a workpiece.

Figure 7:
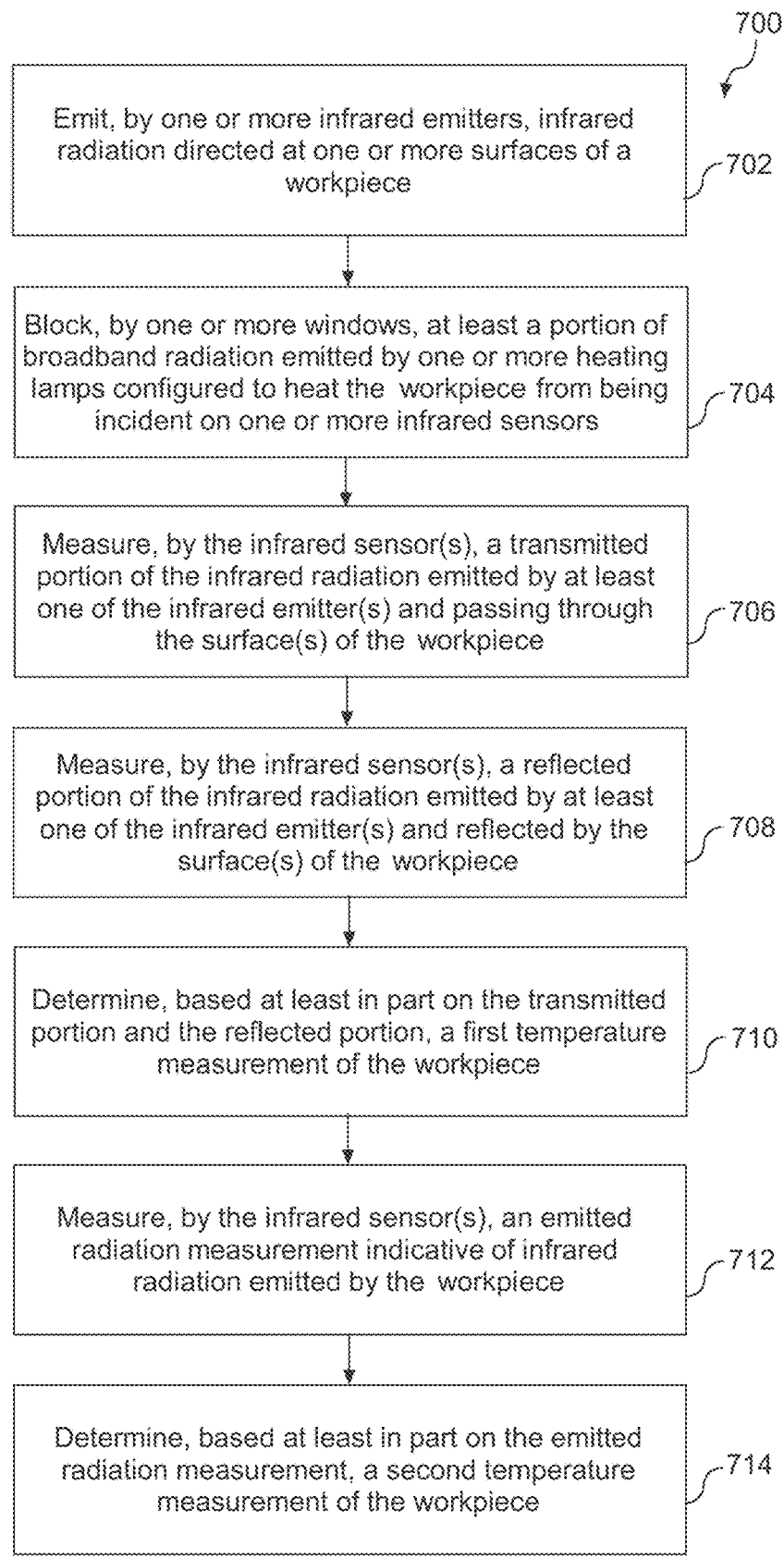
FIG. 7 depicts a method for temperature measurement of a workpiece in a thermal processing system according to example aspects of the present disclosure.

FIG. 7 depicts a flowchart of an example method 700 for measuring a temperature of a workpiece in a thermal processing system, such as, for example, the thermal processing systems 100, 200, or 300 of FIGS. 1-3. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

The method 700 can include, at 702, emitting, by one or more infrared emitters, infrared radiation directed at one or more surfaces of a workpiece. For example, in some embodiments, one or more infrared emitters can emit radiation having a first wavelength and one or more infrared emitters can emit radiation having a second wavelength.

The method 700 can include, at 704, blocking, by one or more windows, at least a portion of broadband radiation emitted by one or more heating lamps configured to heat the workpiece from being incident on one or more infrared sensors. For example, in some embodiments, the one or more windows can block at least a portion of the broadband radiation that is within at least a portion of a measurement range.

The method 700 can include, at 706, measuring, by the one or more infrared sensors, a transmitted portion of the infrared radiation emitted by at least one of the one or more infrared emitters and passing through the one or more surfaces of the workpiece. For example, a first portion of the transmitted portion can be incident on a first transmittance sensor to obtain a first transmittance measurement. The first transmitted portion can correspond to an emitter and/or sensor of an emissivity measurement system. The first transmitted portion can, in some embodiments, have an associated first wavelength. Additionally and/or alternatively, a second portion of the transmitted portion can be incident on at least one second transmittance sensor to obtain at least one second transmittance measurement. In some embodiments, the at least one second transmittance sensor can additionally be configured to measure radiation emitted by a workpiece. In some embodiments, the second transmitted portion can have an associated second wavelength. In some embodiments, the first wavelength can be blocked by the one or more windows and/or the second wavelength can be at least partially passed by the one or more windows. For example, in some embodiments, the first transmitted portion is associated with a first wavelength of the measurement wavelength range and the second transmitted portion is associated with a second wavelength of the measurement wavelength range, wherein the one or more windows block radiation at the first wavelength and allow radiation at the second wavelength.

The method 700 can include, at 708, measuring, by the one or more infrared sensors, a reflected portion of the infrared radiation emitted by at least one of the one or more infrared emitters and reflected by the one or more surfaces of the workpiece. For example, the reflected portion can be incident on a reflectance sensor to obtain a reflectance measurement. In some embodiments, the reflectance sensor can be a portion of an emissivity measurement system.

In some embodiments, measuring, by the one or more infrared sensors, a portion of infrared radiation (e.g., a transmitted portion and/or a reflected portion) emitted by at least one of the one or more infrared emitters can include phase-locking the one or more infrared sensors and/or one or more infrared emitters. For example, phase-locking the one or more infrared sensors and/or the one or more infrared emitters can include pulsing at least one of the one or more infrared emitters at a pulsing frequency. As one example of pulsing one or more emitters, a chopper wheel having one or more slits can be revolved in a field of view of the one or more emitters, such that a constant stream of radiation from the one or more emitters is intermittently allowed, at the pulsing frequency, past the chopper wheel. Thus, the constant stream of radiation can be converted by the revolution of the chopper wheel into a pulsed radiation stream at the pulsing frequency.

Additionally and/or alternatively, phase-locking the one or more infrared sensors and/or the one or more infrared emitters can include isolating at least one measurement from the one or more infrared sensors based at least in part on the pulsing frequency. As one example, measurements from the one or more infrared sensors (e.g., measurements indicative of an intensity of radiation incident on the one or more infrared sensors) that are at and/or in phase with the pulsing frequency can be compared to measurements not at the pulsing frequency and/or out of phase with the measurements in phase with the pulsing frequency, such as by subtracting subsequent measurements at double the pulsing frequency. Thus, signal contributions from components at the pulsing frequency (e.g., emitters) can be isolated from interfering components (e.g., stray radiation, such as heat lamps). In other words, sensor measurements that are not phase-locked to the pulsing frequency (e.g., obtained with the same or greater frequency than the pulsing frequency and/or out of phase with the phase-locked measurements) can be indicative of only stray radiation in the chamber and/or sensor measurements that are phase-locked to the pulsing frequency can be indicative of a sum of stray radiation and emitted radiation from an emitter. Thus, a measurement indicative of emitted radiation emitted by the emitters can be isolated by subtracting out the amount of stray radiation indicated by a measurement that is not phase-locked. As one example, if the pulsing frequency is 130 Hz, the sensor can obtain measurements at 260 Hz or greater, such that one or more stray intensity measurements correspond to each phase-locked measurement. In this way, the thermal processing system can reduce interference from stray radiation (e.g., stray light) in measurements from a sensor.

The method 700 can include, at 710, determining, based at least in part on the transmitted portion and the reflected portion, a temperature of the workpiece. The temperature of the workpiece at 710 can be less than about 600° C. For example, in some embodiments, determining the temperature of the workpiece can include determining, based at least in part on the transmitted portion and the reflected portion, an emissivity of the workpiece, and determining, based at least in part on the transmitted portion and the emissivity of the workpiece, the temperature of the workpiece. For example, in some embodiments, the emissivity of the workpiece can be determined based at least in part on the first transmittance measurement and the reflectance measurement.

The method 700 can include, at 712, measuring, by the one or more infrared sensors, an emitted radiation measurement indicative of infrared radiation emitted by the workpiece. For example, the emitted radiation measurement can be indicative of an intensity of infrared radiation emitted by the workpiece and incident on the one or more sensors. According to example aspects of the present disclosure, the emitted radiation measurement can be obtained once the temperature of the workpiece is high enough such that the workpiece ceases to be transparent to infrared radiation from the emitters and/or begins to emit significant blackbody radiation at a wavelength configured to be measured by the one or more infrared sensors (e.g., within at least a portion of the measurement wavelength range).

In some embodiments, the emitted radiation measurement can correspond to a wavelength of infrared radiation that is blocked by the one or more windows. For example, the emitted radiation measurement can correspond to a wavelength that is and/or is included in the portion of the measurement wavelength range. For example, in some embodiments, the emitted radiation measurement can correspond to an intensity of infrared radiation having a wavelength of 2.7 micrometers.

The method 700 can include, at 714, determining, based at least in part on the emitted radiation measurement, the temperature of the workpiece. The temperature of the workpiece at 714 can be greater than about 600° C. For instance, determining the temperature of the workpiece greater than about 600° C. can include comparing the emitted radiation measurement to a blackbody radiation curve associated with the workpiece. The blackbody radiation curve can correlate an intensity of emitted blackbody radiation to temperature such that temperature can be determined based on a measured intensity (e.g., the emitted radiation measurement).

Systems implementing method 700 can experience an increased temperature range over which the temperature of the workpiece can be measured. For instance, the method 700 can include determining, based at least in part on the transmitted portion and the reflected portion, the temperature of the workpiece according to, for instance, steps 702-710 for temperatures at which the emitted radiation measurement cannot be practically obtained (e.g., below about 600° C.). Additionally, the method 700 can include determining, based at least in part on the emitted radiation measurement, the temperature of the workpiece according to, for instance, steps 712-714 for temperatures at which the emitted radiation measurement can be practically obtained (e.g., above about 600° C.).

Figure 8:
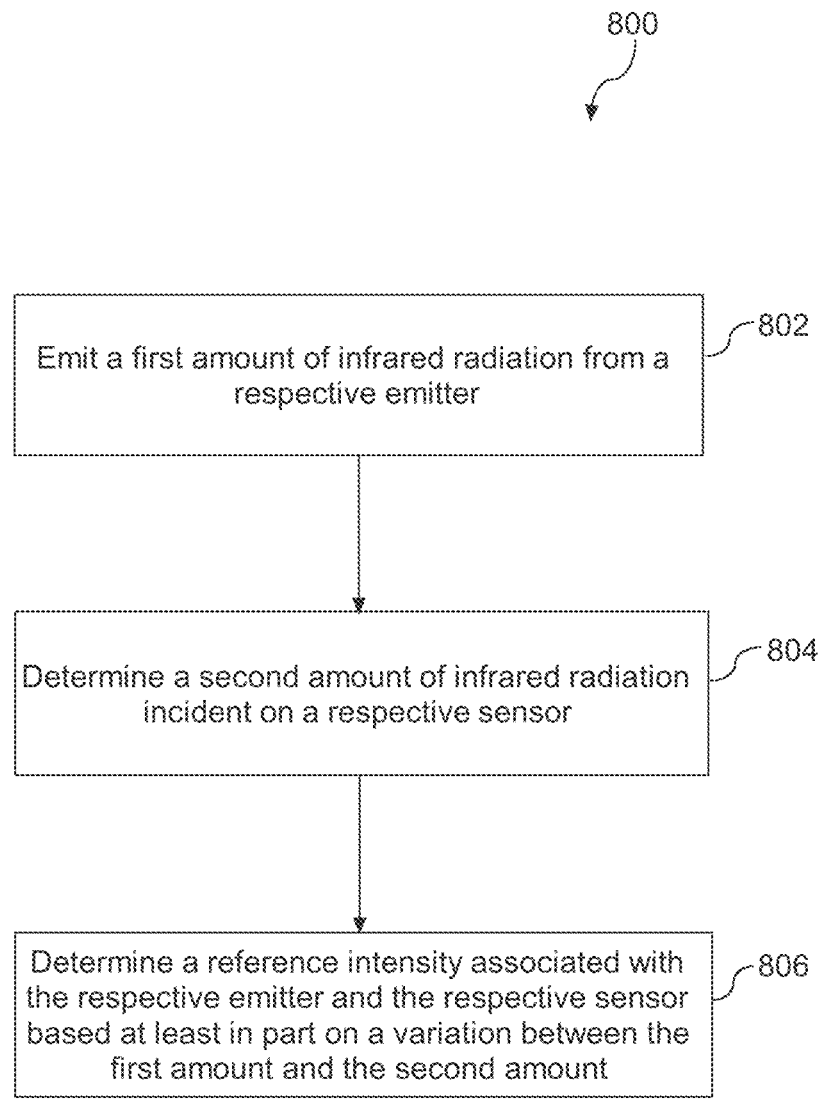
FIG. 8 depicts a method for calibrating a reference intensity for sensors in a thermal processing system according to example aspects of the present disclosure.

FIG. 8 depicts a flowchart of an example method 800 for calibrating a reference intensity for sensors in a thermal processing system, such as, for example, the thermal processing systems 100, 200, or 300 of FIGS. 1-3. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

The method 800 can include, at 802, emitting a first amount of infrared radiation from a respective emitter of the plurality of infrared emitters. The method 800 can include, at 804, determining a second amount of infrared radiation incident on a respective sensor of the plurality of infrared sensors. The method 800 can include, at 806, determining the reference intensity associated with the respective emitter and the respective sensor based at least in part on a variation between the first amount and the second amount.

According to example aspects of the present disclosure, a reference intensity, denoted herein as $I_0$, can be determined for each of one or more sensors in a thermal processing system. A reference intensity can correspond to radiation emitted by an emitter and/or incident on a sensor when a workpiece is not present in the processing chamber. In other words, the reference intensity can be diminished from the intensity of radiation emitted by an emitter only by contributions from components other than the workpiece in the thermal processing system. This can additionally correspond to a case of 100% transmittance by a workpiece. In some embodiments, the reference intensity can be measured prior to insertion of a workpiece in the processing chamber, such as between thermal processing of two workpieces.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system for performing thermal processing of a semiconductor workpiece, the thermal processing system comprising:
   a workpiece support plate configured to support a workpiece;
   one or more heat sources configured to heat the workpiece;
   a window disposed between the workpiece support plate and the one or more heat sources, the window comprising one or more transparent regions that are transparent to at least a portion of electromagnetic radiation within a measurement wavelength range; and
   a temperature measurement system configured to obtain a temperature measurement indicative of a temperature of the workpiece based at least in part on one or more measurement from a plurality of infrared sensor when the temperature of the workpiece is less than about 600° C.

2. The thermal processing system of claim 1, wherein the workpiece support plate is transparent and configured to pass at least a portion of electromagnetic radiation through the workpiece support plate.

3. The thermal processing system of claim 1, wherein each infrared sensor corresponds to one of the plurality of infrared emitters, each of the plurality of infrared emitters configured to emit infrared radiation directed at the workpiece, wherein at least a portion of infrared radiation transmitted through the workpiece.

4. The thermal processing system of claim 1, wherein each infrared sensor corresponds to one of the plurality of infrared emitters, each of the plurality of infrared emitters configured to emit infrared radiation directed at the workpiece, wherein at least a portion of infrared radiation reflected by the workpiece.

5. The thermal processing system of claim 1, wherein the temperature measurement system comprising a plurality of infrared emitters positioned outside of a workpiece processing chamber.

6. The thermal processing system of claim 1, wherein the temperature measurement system comprising an emissivity measurement system configured to measure an emissivity of the workpiece, wherein the temperature measurement system obtained the temperature measurement indicative of the temperature of the workpiece based at least in part on the emissivity of the workpiece.

7. The thermal processing system of claim 6, wherein the emissivity measurement system comprises an infrared emitter configured to emit infrared radiation directed toward the workpiece.

8. The thermal processing system of claim 1, wherein the temperature measurement system comprising a transmittance measurement system configured to obtain one or more transmittance measurements of a workpiece.

9. The thermal processing system of claim 8, wherein the transmittance measurement system obtained a center transmittance measurement of a center portion of the workpiece and an edge transmittance measurement of an edge portion of the workpiece.

10. The thermal processing system of claim 1, wherein the temperature measurement system comprising an emissivity measurement system and a transmittance measurement system.

11. The thermal processing system of claim 10, wherein the emissivity measurement system and the transmittance measurement system operate at a same wavelength.

12. The thermal processing system of claim 1, wherein at least one infrared sensor of the plurality of the infrared sensor is phase-locked, the infrared sensor is pulsed at a pulsing frequency.

13. The thermal processing system of claim 5, wherein at least one infrared emitter of the plurality of infrared emitters is phase-locked, the least one infrared emitter is pulsed at a pulsing frequency.

14. The thermal processing system of claim 1, wherein the one or more heat sources are configured to emit broadband radiation to heat the workpiece.

15. The thermal processing system of claim 14, wherein the window comprises one or more opaque regions are configured to block at least a portion of the broadband radiation emitted by the heat sources and within the measurement wavelength range.

16. The thermal processing system of claim 1, wherein the at least one infrared sensor comprises one or more pyrometers.

17. A method for determining a temperature of a workpiece in a thermal processing system, the thermal processing system comprising a workpiece support plate configured to support a workpiece; one or more heat sources configured to heat the workpiece; a window disposed between the workpiece support plate and the one or more heat sources, the window comprising one or more transparent regions that are transparent to at least a portion of electromagnetic radiation within a measurement wavelength range; a temperature measurement system comprising an emissivity measurement system and a transmittance measurement system, the method comprising:
obtaining, from a plurality of infrared sensors, one or more measurements associated with the transmittance measurement system; and
determining, based at least in part on the one or more measurements associated with the transmittance measurement system, a temperature of the workpiece when the temperature of the workpiece is less than about 600° C.

18. The method of claim 17, wherein the method further comprises:
obtaining, from the at least one infrared sensor, one or more measurements associated with the emissivity measurement system; and
determining, based at least in part on the one or more measurements associated with the emissivity measurement system, a temperature of the workpiece when the temperature of the workpiece is greater than about 600° C.

* * * * *